(12) United States Patent
Sano et al.

(10) Patent No.: US 7,748,114 B2
(45) Date of Patent: Jul. 6, 2010

(54) METHOD OF FORMING CONDUCTIVE PATTERN

(75) Inventors: Takeshi Sano, Kanagawa (JP); Hideaki Ohkura, Kanagawa (JP); Hirofumi Kobayashi, Kanagawa (JP); Kunio Ikeda, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 1102 days.

(21) Appl. No.: 11/409,452

(22) Filed: Apr. 20, 2006

(65) Prior Publication Data

US 2006/0250452 A1 Nov. 9, 2006

(30) Foreign Application Priority Data

Apr. 28, 2005 (JP) ............................. 2005-133225
Feb. 8, 2006 (JP) ............................. 2006-031258

(51) Int. Cl.
*H05K 3/02* (2006.01)
*H05K 3/10* (2006.01)

(52) U.S. Cl. ......................... 29/846; 174/260; 427/98.5

(58) Field of Classification Search .................. 29/846, 29/847, 825; 174/260; 257/723, 779, 783; 313/512; 361/760, 779, 803; 427/98.5; 430/311, 430/313; 438/669
See application file for complete search history.

(56) References Cited

U.S. PATENT DOCUMENTS 5,077,085 A * 12/1991 Schnur et al. .............. 427/98.5
6,501,663 B1 * 12/2002 Pan ............................. 361/779
6,846,616 B2 * 1/2005 Kobayashi et al. .......... 430/313
7,109,653 B2 * 9/2006 Imamura ..................... 313/512
2004/0108133 A1 6/2004 Sano et al.
2005/0062168 A1 3/2005 Sano et al.

FOREIGN PATENT DOCUMENTS

| JP | 2000-294904 | 10/2000 |
| JP | 2004-6700 | 1/2004 |
| JP | 2004-119479 | 4/2004 |
| JP | 2004-146796 | 5/2004 |
| JP | 2004-170463 | 6/2004 |
| JP | 2004-273851 | 9/2004 |
| KR | 2005-0019024 | 2/2005 |
| KR | 2005-0024261 | 3/2005 |

OTHER PUBLICATIONS

Dec. 13, 2006 Korean official action and English translation thereof.
Jan. 25, 2007 EPO Communication and European Search Report.

* cited by examiner

*Primary Examiner*—Donghai D. Nguyen
(74) *Attorney, Agent, or Firm*—Cooper & Dunham LLP

(57) ABSTRACT

The present invention discloses a method of forming a conductive pattern including the steps of a) printing a conductive pattern onto a surface of a base material having a liquid repellent property, b) providing a lyophilic property to a predetermined area of the surface of the base material which area does not have the conductive pattern printed thereon, and c) forming an insulating layer that covers the conductive pattern.

12 Claims, 17 Drawing Sheets

METHOD OF FORMING CONDUCTIVE PATTERN

BACKGROUND OF THE INVENTION

1. Technical Field

This disclosure relates to an electric component having a conductive pattern formed on a base material, a method of forming the conductive pattern, and an inkjet head using the electric component.

2. Description of the Related Art

For example, in a case of forming a conductive pattern (e.g. electrode, wiring) on a base material (e.g. substrate), particularly, in a case of forming a fine sized conductive pattern, one example of such patterning method is an etching method using photolithography.

However, the patterning method using photolithography requires high cost and complicated steps (e.g. step of forming resist patterns, step of exposing/developing, step of etching with etching gas).

In these years, a printing method (e.g. forming fine conductive patterns with an inkjet method) is drawing attention as one example of a simpler method for forming conductive patterns at a low cost. For example, in a case of forming conductive patterns (e.g. wiring patterns), the printing method is simple and inexpensive compared to the photolithography method or the etching method. As one exemplary method of forming conductive patterns with the printing method, there is a method of forming patterns on a substrate (base material) with use of ink containing conductive materials (e.g. metallic nano ink).

However, in using the method of forming patterns on a substrate (base material) with use of ink containing conductive materials (e.g. metallic nano ink) it is difficult to form the patterns into a fine size. For example, in a case of using metallic nano ink on a substrate, the ink tends to spread when applied onto the substrate surface, to thereby make forming of fine sized patterns difficult.

One method that is proposed for resolving this problem is to form a lyophilic area and a liquid-repellant area on a substrate and utilize this difference of surface energy by forming conductive patterns of, for example, metallic nano ink only at the lyophilic area (See, for example, Japanese Laid-Open Patent Application No.2004-170463). There is also another method of adjusting the water-repellant property of a substrate surface for preventing metallic nano ink from spreading on the substrate surface (See, for example, Japanese Laid-Open Patent Application Nos.2004-6700, 2004-146796, and 2004-119479).

However, with the method disclosed in Japanese Laid-Open Patent Application No.2004-170463, the patterning process for forming the lyophilic area and the liquid-repellant area is complicated, expensive, and time-consuming.

The methods disclosed in Japanese Laid-Open Patent Application Nos.2004-6700, 2004-146796, and 2004-119479 require ink to have an increased contact angle with respect to the substrate surface for enhancing liquid-repellency. However, the enhancing of liquid-repellency (increasing of contact angle) causes the conductive patterns to lose adhering strength with respect to the substrate and makes it difficult to prevent the conductive patterns from separating from the substrate.

SUMMARY

In an aspect of this disclosure, there is provided a method of forming a conductive pattern including the steps of: a) forming a conductive pattern onto a surface of a base material having a liquid repellent property; b) providing a lyophilic property to a predetermined area of the surface of the base material which area does not have the conductive pattern formed thereon; and c) forming an insulating layer that covers the conductive pattern.

The above-mentioned method of forming a conductive pattern may further include a step of: forming an upper conductive pattern on the conductive pattern after step a) by using a plating method.

In the above-mentioned method of forming a conductive pattern, the conductive pattern may include metal particles, wherein the plating method may include an electroless plating method using the metal particles as a catalyst for forming the upper conductive pattern.

In the above-mentioned method of forming a conductive pattern, the plating method may include an electrolytic plating method using the conductive pattern as a feed path for forming the upper conductive pattern.

The above-mentioned method of forming a conductive pattern may further include a step of: forming the base material that has added a releasing agent before step a).

The above-mentioned method of forming a conductive pattern may further include a step of: providing the liquid repellent property to the surface of the base material before step a).

In the above-mentioned method of forming a conductive pattern, the liquid repellent property may be provided to the surface of the base material by applying a plasma excited gas to the surface of the base material.

In the above-mentioned method of forming a conductive pattern, the lyophilic property may be provided to the predetermined area by applying a plasma excited gas to the surface of the base material in step b).

The above-mentioned method of forming a conductive pattern may further include the steps of: connecting the base material to a function element on which a second conductive pattern is formed; and forming a third conductive pattern on at least a part of the conductive pattern and a part of the second conductive pattern.

In the above-mentioned method of forming a conductive pattern, the step a) may include the steps of: forming a mask pattern on a supporting substrate; growing the conductive pattern in an aperture part of the mask pattern by using a plating method, and transferring the conductive pattern to the base material.

In another aspect of this disclosure, there is provided an electric component including: a base material having a surface on which a conductive pattern; and an insulating layer formed on a predetermined area of the surface of the base material in a manner covering the conductive pattern; wherein the surface of the predetermined area on which the insulating layer is formed has a lower lyophilic property than the surface on which the conductive pattern is formed.

The above-mentioned electric component may further include an upper conductive pattern that is formed on the conductive pattern, wherein the upper conductive pattern has a composition which is different from that of the conductive pattern.

In the above-mentioned electric component, the upper conductive pattern may have less stress than the conductive pattern.

In the above-mentioned electric component, the conductive pattern may include metal particles.

The above-mentioned electric component may further include: a function element that is connected to the base material, the function element having a surface on which a second conductive pattern is formed; and a third conductive pattern formed on at least a part of the conductive pattern and a part of the second conductive pattern.

The above-mentioned electric component may further include: a connection part formed between the function element and the base material, the connection part having a connection surface situated between the surface of the base material and the surface of the function element; wherein the connection part includes a resin material.

In the above-mentioned electric component, the third conductive pattern may contact the conductive pattern, the second conductive pattern, and the connection surface.

In another aspect of this disclosure, there is provided an inkjet head including the above-mentioned electric component.

The above-mentioned and other aspects, features and advantages will be apparent from the following detailed description when read in conjunction with the accompanying drawings.

DESCRIPTION OF THE PREFERRED EMBODIMENTS

Figure 1A:
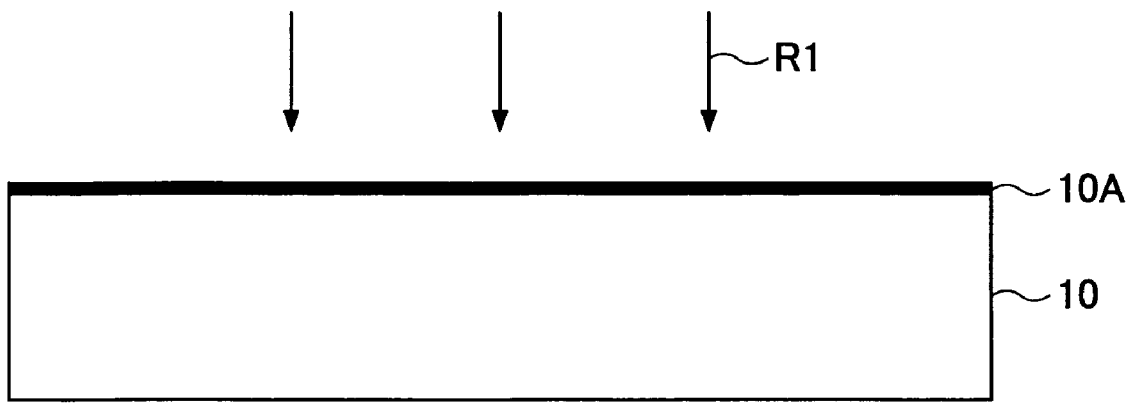
FIGS. 1A-1D are schematic drawings for describing a method of forming a conductive pattern according to a first embodiment of the present invention.

In the following, embodiments of the present invention are described with reference to the accompanying drawings.

The electric component according to an embodiment of the present invention includes a base material having a surface on which a conductive pattern is formed and an insulating layer formed on the surface of the base material in a manner covering the conductive pattern. On the surface of the base material, the area contacting the insulating layer has a liquid repellent property (liquid repellency) that is less than that of the area (layer) on which the conductive pattern is formed.

Therefore, in a case where the conductive pattern is formed with ink by employing, for example, a printing method, the ink can be prevented from spreading on the surface of the substrate since the conductive pattern is formed on the area having high liquid repellency. Accordingly, the electric component has a configuration enabling fine conductive patterns to be formed thereon. In addition, since the insulating layer, which covers the conductive pattern, is formed in a manner contacting the area having low liquid repellency (i.e. lyophilic area), the insulating layer can satisfactorily adhere onto the substrate. Accordingly, the electric component has a secure structure which prevents the conductive pattern from separating from the surface of the substrate.

Furthermore, by using the electric component as an inkjet head of an inkjet printer, the inkjet head can be formed with fine wiring patterns and a secure structure, can be obtained.

The electric component is formed by a method including, for example, the steps of: printing a conductive pattern on a liquid repellent surface of a base material (first step); providing a lyophilic property to an area of the base material surface having no conductive pattern formed thereon (second step); and forming an insulating layer covering the conductive pattern on the base material surface (third step).

Since this method forms a conductive pattern by using a printing technique, the conductive pattern can be formed more easily and inexpensively compared to, for example, a method of forming a conductive pattern using a photolithographic technique.

Since the base material surface on which the printing method is performed has a liquid repellent property (low surface energy), the conductive pattern (ink) applied onto the base material surface can be prevented from spreading, to thereby enable fine conductive patterns to be formed.

Furthermore, after the conductive pattern is formed on the base material surface, the base material surface is subjected to a process of providing a lyophilic property (high surface energy) to an area(s) of the base material surface having no conductive pattern formed thereon (lyophilic process). Then, an insulating layer (overcoat layer) is formed in a manner covering the conductive pattern and contacting the lyophilic area of the base material surface.

Since the part of the base material surface contacting the insulating layer has a lyophilic property, the adhering strength between the lyophilic area of the base material surface and the insulating layer can be increased. Accordingly, the insulating layer can firmly adhere to the base material surface, and the conductive pattern can be prevented from separating from the base material surface. Conventionally, it is difficult to form fine conductive patterns on a base material and at the same time attain sufficient adhering strength between the conductive pattern and the base material by using the printing method.

First Embodiment

FIGS. 1A-1D show a method of forming a conductive pattern according to the first embodiment of the present invention.

In the step shown in FIG. 1A, a liquid repellent surface 10A is formed on the surface of a base material 10 comprising a resin material (e.g. PET (polyethylene terephthalate) by providing a liquid repellent property (liquid repellency) to the surface of the base material 10. That is, the liquid repellent surface 10A is formed by applying a liquid repellent material onto the surface of the base material 10 (liquid repellency process). In this case, the base material includes, for example, a planar material such as a substrate, or a material formed in other shapes. The liquid repellency process is for providing or increasing the liquid repellent property (liquid repellency) of the surface of the base material 10, that is, reducing the level of surface energy of the base material 10. By performing the liquid repellency process on the base material, the contact angle of a predetermined liquid on the surface of the base material 10 can be increased.

The liquid repellency process is performed by, for example, forming a C—F bond on the base material surface. The C—F bond can be formed by applying an activated fluorochemical gas (e.g. fluorocarbon gas) to the base material surface.

In this embodiment, although not shown in the drawings, an atmospheric pressure plasma surface processing apparatus (remote type plasma processing apparatus manufactured by Sekisui Chemical) is used for performing the liquid repellent process on the base material 10. More specifically, $CF_4$ gas is supplied to the surface processing apparatus at a rate of 0.5 L/min, next a processing gas R1 is formed by activating the $CF_4$ gas with plasma, and then the processing gas R1 is applied onto the surface of the base material 10.

By conducting ESCA analysis (also referred to as XPS (X-ray Photoelectron Spectroscopy) analysis) on the surface of base material for examining the surface of the base material 10 after the liquid repellent process is performed on the base material 10, a C—F bond was found. Furthermore, it was also found that the contact angle of water (pure water) on the surface of the base material 10 (after the liquid repellent process) is 80 degrees or more.

Figure 1B:
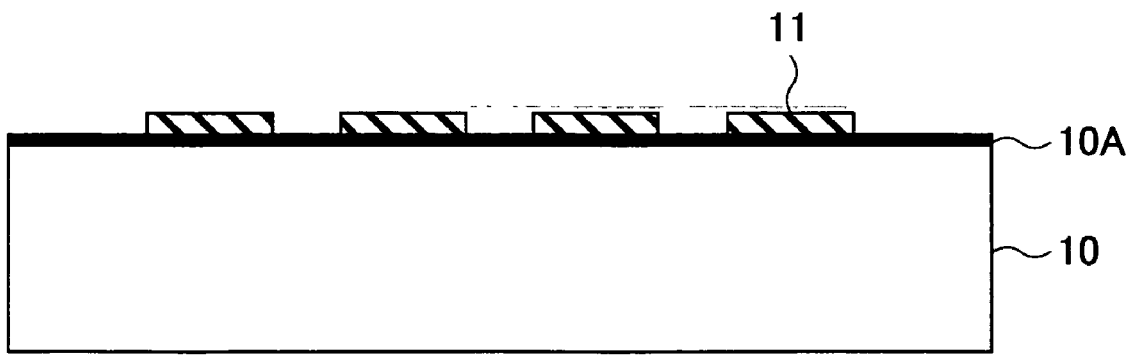

Next, in the step shown in FIG. 1B, a conductive pattern 11 is formed on the surface of the base material 10 (i.e. liquid repellent surface 10A) by using a printing method. More specifically, a silver nanoink (manufactured by Sumitomo Electric Industries Ltd.) is applied on the liquid repellent surface 10A by using, for example, an inkjet method. Since the liquid repellent surface 10A has a high liquid repellency, the diameter of the area at which an ink droplet contacts the liquid repellent surface 10A is 40 μm, and therefore, the width of the conductive pattern 11 is 40 μm.

The printing method according to an embodiment of the present invention is not limited to an inkjet method. Other printing methods, such as a screen printing method, a relief printing method, an intaglio printing method, or a silkscreen printing method may also be employed. Furthermore, the conductive pattern that is formed with the printing method is not limited to a wiring pattern, but other patterns may also be formed.

Figure 1C:
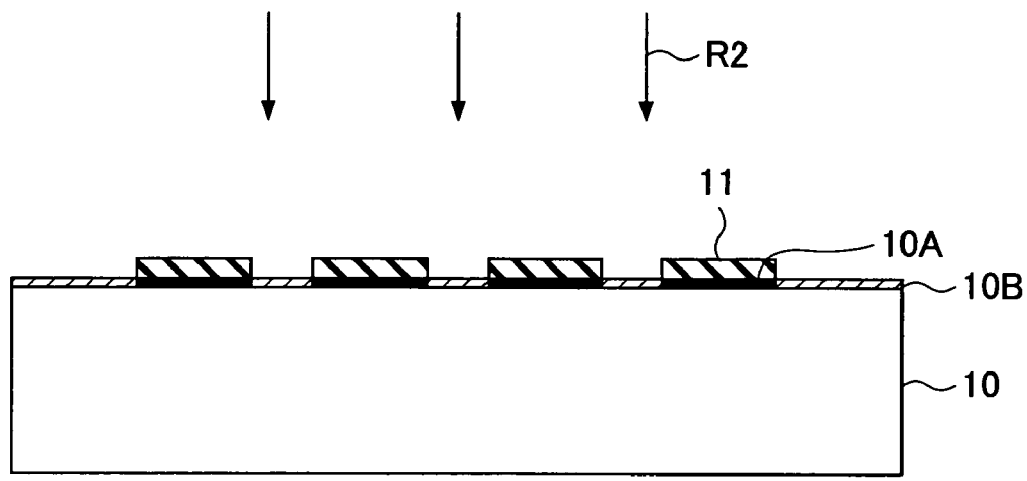

Next, in the step shown in FIG. 1C, a process of providing a lyophilic property (lyophilic process) is performed on the areas of surface of the base material 10 on which no conductive pattern 11 is formed, that is, the areas of the liquid repellent surface 10A which are not covered by the conductive pattern 11. Accordingly, a lyophilic surface 10B is formed on these areas. In this example, the lyophilic process is performed by reducing the liquid repellency by increasing the surface energy of these areas of the substrate surface. After performing the lyophilic process, the contact angle with respect to a predetermined liquid becomes smaller at the base material surface.

The lyophilic process according an embodiment of the present invention is performed, for example, by dissolving the C—F bond on the base material surface. The process of dissolving the C—F bond is performed, for example, by applying an activated oxygen gas and oxygen-diluted gas (e.g. nitrogen gas) on the base material surface (liquid repellent surface 10A).

In this embodiment, although not shown in the drawings, an atmospheric pressure plasma surface processing apparatus (remote type plasma processing apparatus manufactured by Sekisui Chemical) is used for performing the lyophilic process on the base material 10. More specifically, oxygen gas and nitrogen gas are supplied to the surface processing apparatus, next a processing gas R2 is formed by activating the gases with plasma, and then the processing gas R2 is applied onto the surface of the base material 10 (liquid repellent surface 10A). Thereby, the lyophilic surface 10B can be formed on predetermined areas on the surface of the base material 10. Accordingly, the surface energy becomes greater at areas which are not covered by the conductive pattern 11. After performing the lyophilic process, it was found that the contact angle with respect to water (pure water) is 30 degrees or less.

Figure 1D:
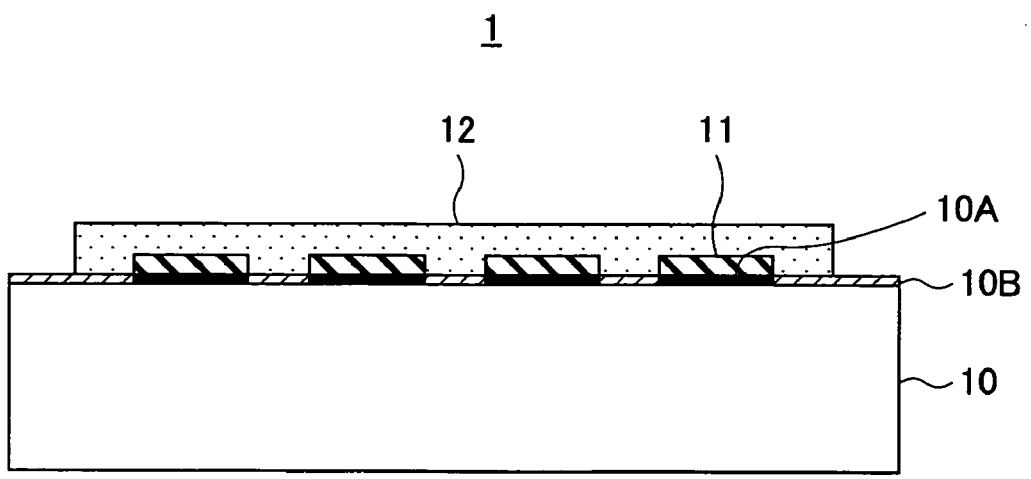

Next, in the step shown in FIG. 1D, an insulating layer 12 is formed on the substrate surface in a manner covering the conductive pattern 11. Since the base material surface is subjected to the lyophilic process, a satisfactory adhering strength between the insulating layer and the lyophilic surface can be obtained.

The insulating layer 12 according to an embodiment of the present invention is formed with a resin material (Hitachi Chemical Co. Ltd., SN-9000 series) and is applied onto the base material surface by using a coating method. Other methods may also be employed for forming the insulating layer 12, such as a lamination method or a CVD method. Furthermore, the insulating layer 12 may be formed with other materials, such as an epoxy resin, a polyimide resin, a resist material, or a vapor proof material.

In addition to preventing the conductive pattern 11 from separating from the base material surface, the insulating layer 12 also serves as a protective layer of the conductive pattern 11 for preventing the conductive pattern 11 from being damaged.

Then, the base material 10 is heated at a temperature of 200° C. for 30 minutes. The heating process causes the dispersion materials of silver nanoink included in the conductive pattern 11 to volatilize (evaporate) and the silver particles included in the conductive pattern 11 to fuse together. Furthermore, the heating process also serves to thermally cure the insulating layer 12. In this case, it is preferable to use a thermosetting resin material as the material of the insulating layer 12.

The process of heating the conductive pattern 11 and the process of heating the insulating layer 12 may be performed separately. In one exemplary case, in the process shown in FIG. 1B, the process of heating the conductive pattern 11 may be performed between the step of forming (printing) the conductive pattern 11 and the step of forming the insulating layer 12, and the process of heating the insulating layer 12 may be performed after the step of forming the insulating layer 12. In this case, the dispersion material (also referred to as active material) included in the silver nanoink becomes easier to volatilize (evaporate) since the conductive pattern 11 is not covered by the insulating layer 12 during the process of heating the conductive pattern 11.

Hence, by conducting the above-described method of forming a conductive pattern, an electric component 1 comprising the base material 10 having the conductive pattern 11 formed on its surface and the insulating layer 12 formed on the surface of the base material 10 in a manner covering the conductive pattern 11 can be fabricated.

At the surface of the base material 10 included in the electric component 1, the lyophilic process is performed on the area at which the insulating layer 12 is to be formed (i.e. lyophilic surface 10B). Accordingly, the surface of the area at which the insulating layer 12 is formed has a lower liquid repellent property than the surface of the area at which the conductive pattern 11 is formed.

Thus, a fine sized conductive pattern 11 can be formed by performing a printing method on the liquid repellent surface 10A having high liquid repellent property. Furthermore, the conductive pattern 11 can be prevented from separating by forming the insulating layer 12 on the lyophilic surface 10B having a low liquid repellent property (high lyophilic property) in a manner covering the conductive pattern 11.

The adhering strength between the insulating layer 12 and the surface of the base material 10 is increased by performing the lyophilic process on the areas of the surface of the base material 10 which are not covered by the conductive pattern 11. Accordingly, the conductive pattern 11 can be prevented from separating from the base material 10.

Conventionally, although the method of forming conductive patterns by using a printing method is easier and less expensive than using a photolithography method, it is difficult to form the conductive patterns in a fine size. Furthermore, in a conventional method of forming fine size conductive patterns, the adhering strength between the conductive pattern and the base material is reduced when the liquid repellent property of the surface of the base material is increased. This causes the conductive pattern to separate from the base material. Therefore, it is difficult to form such fine conductive patterns while maintaining a secure configuration.

Meanwhile, with the above-described embodiment of the present invention, in addition to forming fine conductive patterns on the base material having a liquid repellent surface, the areas of the base material surface on which there is no conductive pattern is subjected to a lyophilic process, so that an insulating layer is formed on the lyophilic processed areas in a manner covering the conductive pattern.

Accordingly, a fine conductive pattern can be formed on a base material with a simple method, and a secure configuration that prevents the conductive pattern from separating from the base material can be fabricated.

Although a process of providing a liquid repellent property is performed on the surface of a resin material (base material) according to the above-described embodiment of the present invention, such process may be omitted by employing a base material having a liquid repellent property. In this case, the base material having a liquid repellent property is fabricated, for example, by adding a predetermined releasing agent to a resin material and curing the resin material.

Furthermore, the method of providing a liquid repellent property and/or a lyophilic property to the surface of the base material is not limited to the above-described method of employing a processing gas activated by plasma.

For example, as another method of providing a liquid repellent property, a coating having a liquid repellent property can be formed on the surface of the base material by using a coating method. Furthermore, as another method of providing a lyophilic property, the lyophilic property may be obtained by applying various energies (e.g. plasma excited gas) to the base material.

It is to be noted that, a base material surface having a liquid repellent property (a surface of a base material having a liquid repellent property) basically means that the contact angle of a predetermined liquid (for example, the ink used in the above-described printing method, such as a metallic nano ink used in an inkjet printing method) is no less than a predetermined angle with respect to the base material surface. Accordingly, it is hereinafter defined that the base material surface according to an embodiment of the present invention has a liquid repellent property in a case when the ink has a contact angle that is 30 degrees or more (i.e. no less than 30 degrees) with respect to the base material surface. This case is substantially the same as a case when water (pure water) has a contact angle that is approximately 50 degrees or more with respect to the base material surface.

It is, however, to be noted that the conductive pattern may become segmented when the liquid repellent property is too high (i.e. when the contact angle is too large). This makes it difficult to form, for example, a linearly extending conductive pattern. Therefore, it is preferable to form a liquid repellent surface (base material surface) so that the contact angle of the ink is no greater than 100 degrees with respect to the liquid repellent surface (base material surface).

That is, according to the above-described embodiment of the present invention, it is preferable to form the liquid repellent surface 10A so that the ink used in the printing method (e.g. metallic nano ink used in an inkjet method) has a contact angle that is no less than 30 degrees and no greater than 100 degrees with respect to the base material surface (liquid repellent surface 10A). It is more preferable to form the liquid repellent surface 10A so that the ink used in the printing method (e.g. metallic nano ink used in an inkjet method) has a contact angle that is no less than 50 degrees and no greater than 100 degrees with respect to the base material surface (liquid repellent surface 10A).

From another aspect, it is preferable to form the liquid repellent surface 10A so that water (pure water) has a contact angle that is no less than 50 degrees and no greater than 120 degrees with respect to the base material surface (liquid repellent surface 10A).

It is to be noted that, a base material surface (area) having a lyophilic property basically means that the contact angle of a predetermined liquid is no greater less than a predetermined degree with respect to the base material surface (area). For example, the base material surface according to an embodiment of the present invention has a lyophilic property in a case when water (pure water) has a contact angle that is approximately 40 degrees or less with respect to the base material surface.

According to the above-described embodiment of the present invention, it is preferable to form the lyophilic surface 10B so that the water (pure water) has a contact angle that is no greater than 30 degrees with respect to the base material surface (lyophilic surface 10B). This achieves a satisfactory adhering strength between the insulating layer 12 and the base material 10.

Second Embodiment

FIGS. 2A-2D show a method of forming a conductive pattern according to the second embodiment of the present invention.

Figure 2A:
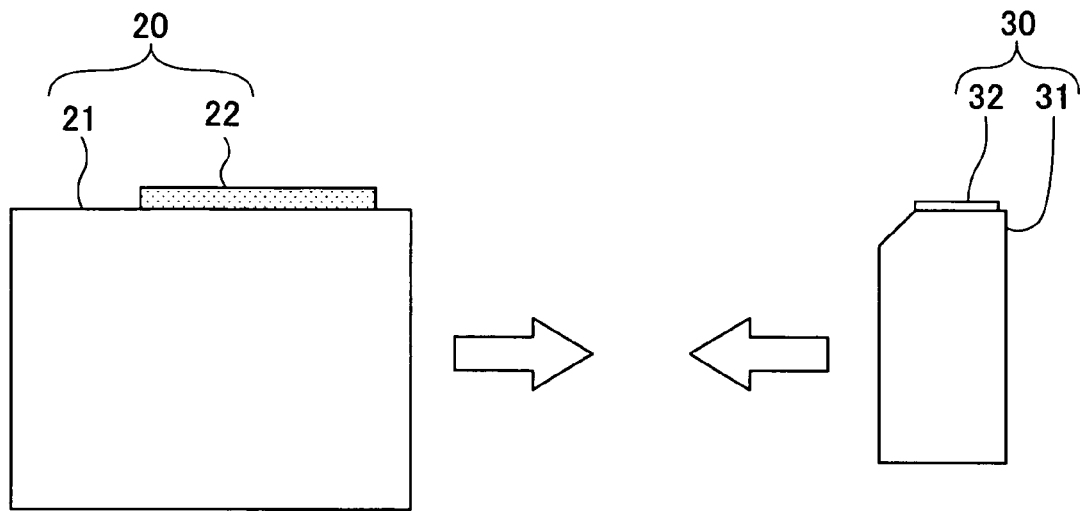
FIGS. 2A-2D are schematic drawings for describing a method of forming a conductive pattern according to a second embodiment of the present invention.

In the step shown in FIG. 2A, a substantially rectangular-shaped base material 21 is formed, for example, by molding a Polyphthalamide (PPA) resin. Next, a conductive pattern (e.g. wiring pattern) 22 is formed on a surface part of the base material 21 by using, for example, a photolithography method and/or a plating method. In this embodiment, the conductive pattern 22 is formed in plural rows on the surface part of the base material 21. The plural rows of the conductive pattern 22 are aligned substantially in parallel and spaced apart with a pitch of 170 μm. The conductive pattern 22 is formed with a thickness of approximately 8 μm by performing AU plating on the surface part of the base material 21. Thereby, a first structure 20 having the conductive pattern 22 formed on the surface of the base material 21 is fabricated.

Furthermore, an electrode 32 is formed on a substantially rectangular function element 31. Thereby, a second structure 30 is fabricated. The edge of the function element 31 according to an embodiment of the present invention is chamfered.

Figure 2B:
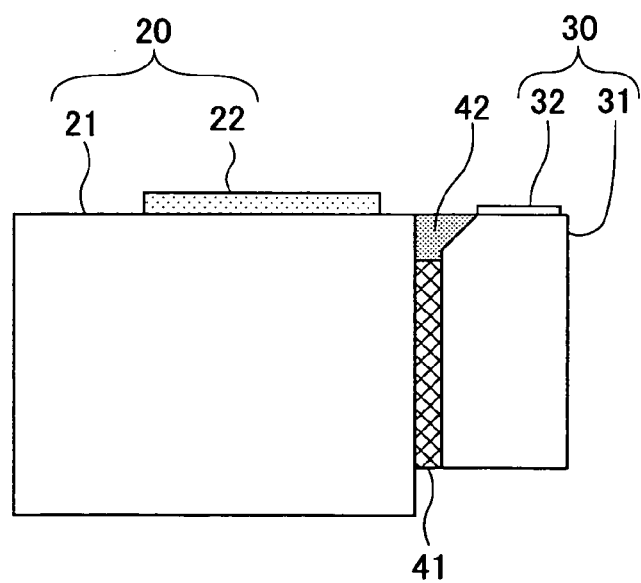

Next, in the step shown in FIG. 2B, the first structure 20 and the second structure 30 are bonded together by using, for example, an anaerobic adhesive. The first structure 20 and the second structure 30 are bonded together in a manner so that the surface of the base material 21 on which the conductive pattern 22 is formed is substantially flush with the surface of the function element 31 on which the electrode 32 is formed.

Furthermore, a surface joint part 42 is formed at the chamfered edge of the function element (as shown in FIG. 2B, facing the base material 21 and situated in the vicinity of the surface on which the electrode 32 is formed).

The surface joint part 42 is formed by applying an epoxy resin based underfill material to the chamfered edge with a dispenser and thermally curing the underfill material applied to the chamfered edge. Accordingly, a connection surface is obtained by forming the surface joint part 42 between the surface of the base material 21 on which the conductive pattern 22 is formed and the surface of the function element 31 on which the electrode 32 is formed. The connection surface is substantially flush with the surface of the base material 21 on which the conductive pattern 22 is formed and the surface of the function element 31 on which the electrode 32 is formed.

Furthermore, the function element 31 and the electrode 32 are cut into strip-like structures, for example, by using a dicing machine, so that plural structures including the electrode 32 and the function element 31 can be fabricated in correspondence with plural conductive patterns 22.

Figure 2C:
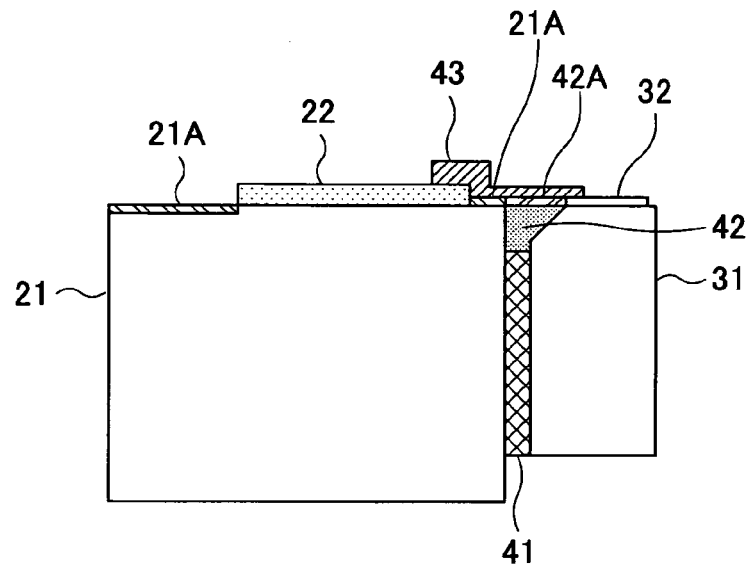

Next, in the step shown in FIG. 2C, a liquid repellent surface 21A is formed on the surface of the base material 21 by providing a liquid repellent property (liquid repellency) to the surface of the base material (liquid repellency process) in a manner similar to the step shown in FIG. 1A of the first embodiment of the present invention. The liquid repellency process is performed by, for example, forming a C—F bond on the base material surface. The C—F bond can be formed by applying an activated fluorochemical gas (e.g. fluorocarbon gas) to the base material surface.

In this embodiment, although not shown in the drawings, an atmospheric pressure plasma surface processing apparatus (remote type plasma processing apparatus manufactured by Sekisui Chemical) is used for performing the liquid repellent process on the base material 21. More specifically, $CF_4$ gas is supplied to the surface processing apparatus at a rate of 0.5 L/min, then a processing gas is formed by activating the $CF_4$ gas with plasma, and then the processing gas is applied onto the surface of the base material 21. Furthermore, at the same time of forming the liquid repellent surface 21A, a liquid repellent surface 42A is formed on the above-described connection surface on the surface joint point part 42.

Next, a conductive pattern (upper conductive pattern) 43 is formed in a manner similar to the step shown in FIG. 1B of the first embodiment of the present invention. The upper conductive pattern 43 is formed by applying (jetting) a silver nanoink (manufactured by Sumitomo Electric Industries Ltd.) by using, for example, an inkjet method. The conductive pattern 43 is formed as a substantially straight line extending from the conductive pattern 22 to the electrode 32 via the liquid repellent surfaces 21A and 42A, so that the conductive pattern 22 and the electrode 32 are electrically connected. In this case, since the liquid repellent surfaces 21A, 42A have a liquid repellent property, fine conductive patterns can be formed thereon. For example, in this case, the upper conductive pattern 43 can be formed having a width that is no greater than 50 μm.

Although the upper conductive pattern 43 is mostly formed having a thickness of approximately 8 μm, the stepped area between the conductive pattern 22 and the liquid repellent surface 21A is formed having a thickness of 10 μm for preventing the upper conductive pattern 43 from becoming disconnected (cut off) at the stepped area.

Figure 2D:
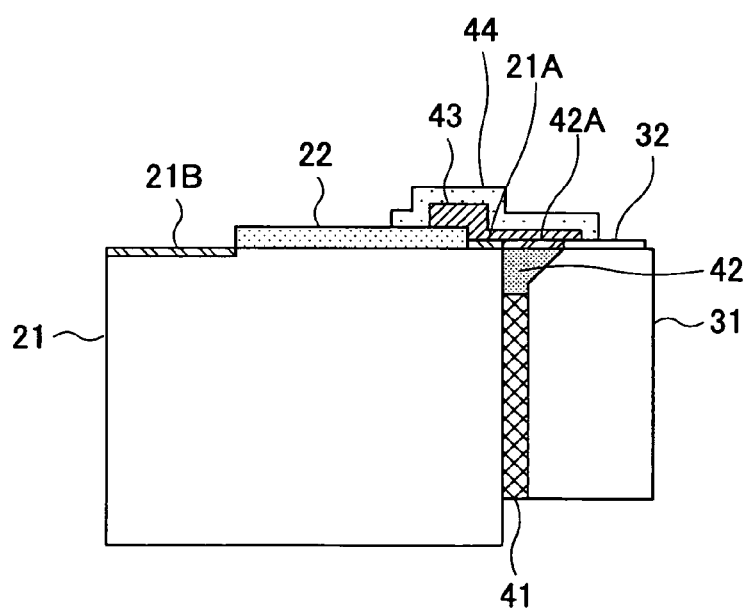

Next, in the step shown in FIG. 2D, a process of providing a lyophilic property (lyophilic process) is performed (in a manner similar to the step shown in FIG. 1C of the first embodiment of the present invention) on the areas of the surface of the base material 21 on which no conductive patterns 22, 43 are formed, that is, the areas of the liquid repellent surfaces 21A, 42A which are not covered by the conductive patterns 22, 43. Accordingly, lyophilic surfaces 21B, 42B are formed on these areas (See FIG. 3). The lyophilic process according an embodiment of the present invention is performed, for example, by dissolving the C—F bond on the base material surface. The process of dissolving the C—F bond is performed, for example, by applying an activated (excited) oxygen gas and oxygen-diluted gas (e.g. nitrogen gas) on the base material surface (liquid repellent surfaces 21A, 42A).

In this embodiment, although not shown in the drawings, an atmospheric pressure plasma surface processing apparatus (remote type plasma processing apparatus manufactured by Sekisui Chemical) is used for performing the lyophilic process on the base material 21 and the surface joint part 42. More specifically, oxygen gas and nitrogen gas are supplied to the surface processing apparatus, next a processing gas is formed by activating (exciting) the gases with plasma, and then the processing gas is applied onto the surface of the base material 21 and the surface of the surface joint part 42 (connection surface). Thereby, the lyophilic surfaces 21B, 42B can be formed on predetermined areas on the surface of the base material 21 and the surface joint part 42.

Next, in a manner similar to the step shown in FIG. 1D, an insulating layer 44 is formed in a manner covering the upper conductive pattern 43. The insulating layer 44 is formed not only on a part of the conductive pattern 22 and a part of the electrode 32, but also on the lyophilic area on the base material 21 (lyophilic surface 21B) and the lyophilic area on the surface joint part 42 (lyophilic surface 42B). In other words, the insulating layer 44 is formed in-between adjacent conductive patterns 22 and in-between adjacent upper conductive patterns 43. Since the surface of the base material 21 and the surface of the surface joint part 42 are subjected to the lyophilic process, satisfactory adhering strength between the insulating layer 44 and these lyophilic surfaces can be obtained. The area in which the insulating layer 44 is formed is described in detail below with reference to FIG. 3.

The insulating layer 44 according to an embodiment of the present invention is formed with a resin material (Hitachi Chemical Co. Ltd., SN-9000 series) and is applied onto the surface of the base material 21 and the surface of the surface joint part 42 by using a coating method. Other methods may also be employed for forming the insulating layer 44, such as a lamination method or a CVD method. Furthermore, the insulating layer 44 may be formed with other materials, such as an epoxy resin, a polyimide resin, a resist material, or a vapor proof material.

Then, the base material 21 is heated at a temperature of 200° C. for 30 minutes. The heating process causes the dispersion materials of silver nanoink included in the upper conductive pattern 43 to volatilize (evaporate) and the silver particles included in the upper conductive pattern 43 to fuse together. Furthermore, the heating process also serves to thermally cure the insulating layer 44. In this case, it is preferable to use a thermosetting resin material as the material of the insulating layer 44.

Since a satisfactory adhering strength between the insulating layer 44 and the lyophilic surfaces 21B, 42B can be attained with the above-described configuration, the upper conductive pattern 43 can be prevented from separating and a secure structure can be obtained.

The above-described method of forming the conductive patterns enables fabrication of an electric component 40 having the base material 21 connected to the function element 31 and having the conductive pattern 22 connected to the electrode 32 with the upper conductive pattern 43 covered by the insulating layer 44.

Furthermore, the electric component 40 according to the above-described embodiment of the present invention can be employed as an inkjet head of an image forming apparatus. In this case, it is preferable to mount a driver IC of the function element by a flip chip method for connecting to the upper conductive pattern 43.

Figure 3:
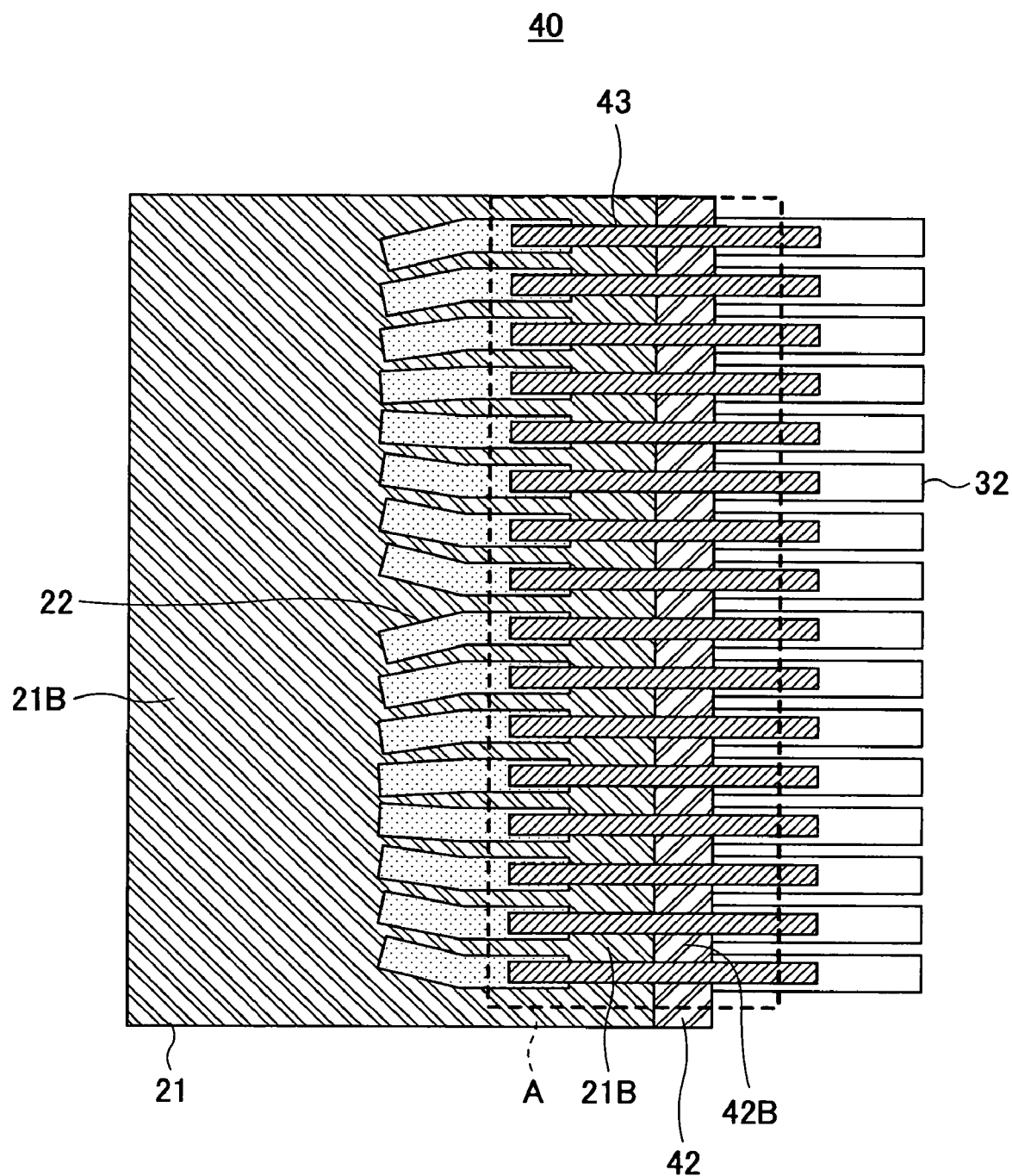
FIG. 3 is a plan view of an electric component according to the second embodiment of the present invention.

FIG. 3 is a plan view of the electric component (inkjet head) 40 of FIG. 2D when viewed from the side where the insulating layer 44 is formed. It is to be noted that like components are denoted with like reference numerals as of FIGS. 2A-2D and further description thereof is omitted. Furthermore, in FIG. 3, the insulating layer 44 is not illustrated so as to provide a better view of the electric component 40, and the part that is surrounded by broken lines (area A) is the area in which the insulating layer 44 is formed.

As shown in FIG. 3, the electric component (inkjet head) 40 according to the above-described embodiment of the present invention has a configuration in which the upper conductive pattern 43 electrically connects the conductive pattern 22 of the base material 21 to the electrode 32 of the function element 31 (not shown in FIG. 3).

In this case, the electrode 32 and the function element 31 are cut into strip-like structures, for example, by a dicing machine so that plural structures including the electrode 32 and the function element 31 can be fabricated in correspondence with plural conductive patterns 22.

Furthermore, the insulating layer 44 (not shown in FIG. 3) is formed in a manner covering not only the upper conductive pattern 43, but also part of the conductive pattern 22 and part of the electrode 32. Furthermore, the insulating layer 44 (not shown in FIG. 3) is formed in-between adjacently arranged conductive patterns 22 and in-between adjacently arranged upper conductive patterns 43.

In this case, the spaces between the adjacently arranged conductive patterns 22 and the spaces between the adjacently arranged conductive patterns 43 are subjected to the lyophilic process and are thereby formed as lyophilic surfaces 21B. Likewise, the spaces between the conductive patterns 43 on the surface joint part 42 (connection surface) are also subjected to the lyophilic process and are thereby formed as lyophilic surfaces 42B.

Accordingly, since a satisfactory adhering strength between the insulating layer 44 (not shown in FIG. 3) and the lyophilic surfaces 21B, 42B can be attained, the upper conductive pattern 43 can be prevented from separating and a secure structure can be obtained.

Third Embodiment

Although the second embodiment describes the first structure 20 fabricated by directly forming (patterning) the conductive pattern (wiring pattern) 22 onto the base material 21, a conductive pattern may be formed by employing a separate supporting substrate and transferring the conductive pattern onto a base material. An example of forming the conductive pattern by using the transfer method is described below with reference to FIGS. 4A-4F.

Figure 4A:
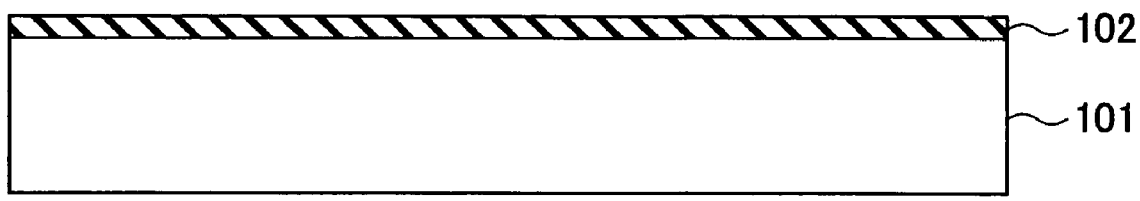
FIGS. 4A-4F are schematic drawings for describing a method of transferring a conductive pattern according to a third embodiment of the present invention.

In the step shown in FIG. 4A, an insulating layer 102 is deposited on a supporting substrate 101 in a thickness of approximately 0.8 µm. The supporting substrate includes, for example, a stainless steel material (JIS standard SUS 304). The insulating layer 102 includes, for example, a diamond like carbon (DLC) material.

Figure 4B:
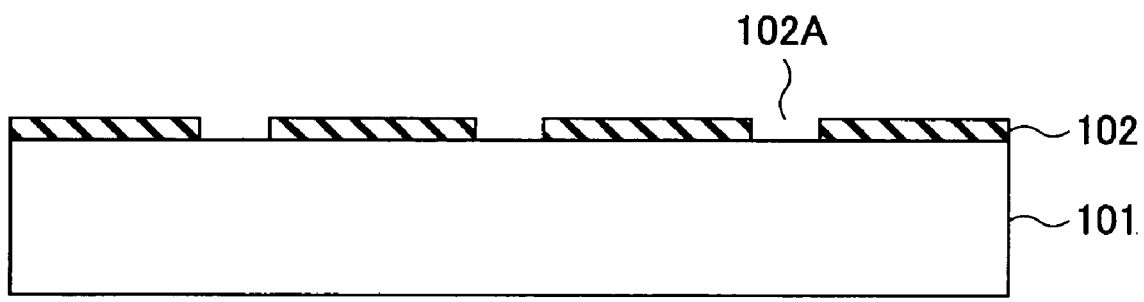

Next, in the step shown in FIG. 4B, plural aperture parts 102A are formed in the insulating layer 102 by performing a RIE (Reactive Ion Etching) method on the insulating layer 102. In this example, a resist pattern formed by a photolithographic method is used as a mask for performing the RIE method. After the aperture parts 102A are formed, the resist is removed from the insulating layer 102. Each aperture part 102A has a width of approximately 70 µm. The aperture parts 102A are spaced from each other with a pitch of 170 µm.

Figure 4C:
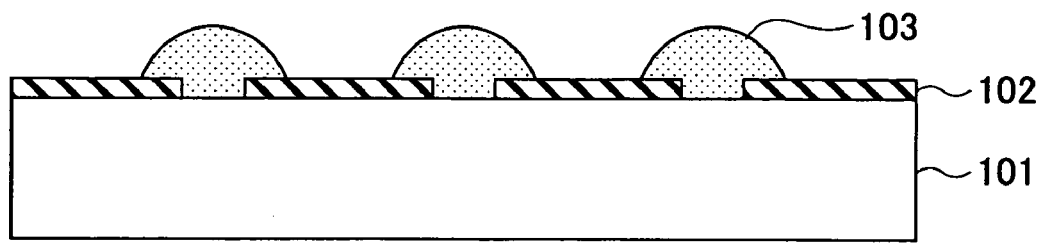

Next, in the step shown in FIG. 4C, the supporting substrate 101 is used as an electrode for performing electrolytic plating, to thereby form conductive patterns (e.g. Cu patterns) 103 at areas corresponding to the aperture parts 102A. The thickness of the conductive patterns 103 is approximately 10 µm. Since the conductive patterns 103 have a greater thickness than the insulating layer 102, the cross-section of the conductive pattern 103 has a mushroom-like shape.

Next, a process of reforming the surface of conductive pattern 103 is described (surface reforming process). In this process, the surface of the conductive pattern 103 is treated with a predetermined chemical agent (Copper Bond, manufactured by Ebara-Udylite Co. Ltd.). This process improves the adhering strength with respect to a base material that is formed covering the exposed parts of the conductive patterns 103 in a subsequent step. By performing the surface reforming process, the thickness of the conductive patterns 103 becomes approximately 8 µm. Thereby, the thickness of the conductive patterns 103 becomes substantially equal to the thickness of the insulating layer 102. It is, however, to be noted that the exposed portion of the conductive patterns 103 protruding from the insulating layer 102 is illustrated in an enlarged manner in FIG. 4C and after for making the configuration easier to understand.

Figure 4D:
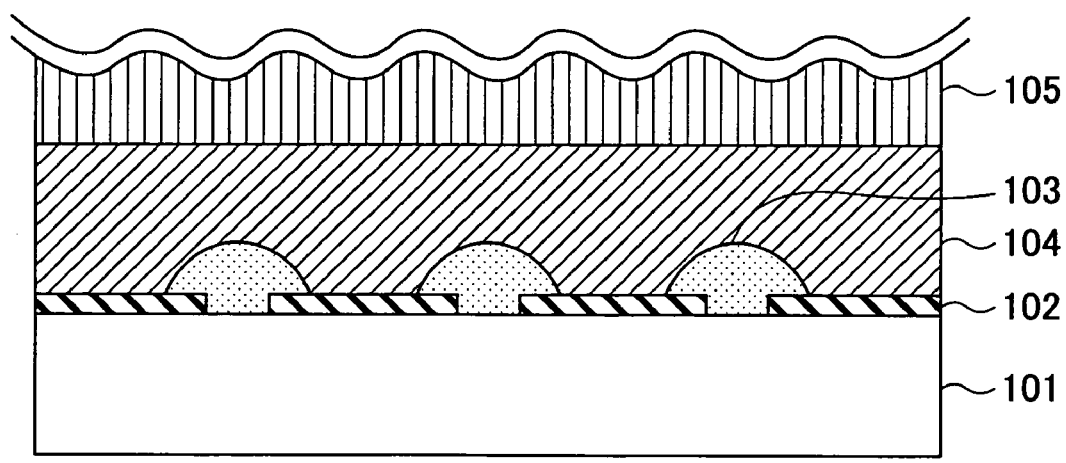

Next, in the step shown in FIG. 4D, a supporting base material 105 is placed above the conductive patterns 103 in a manner facing the supporting substrate 101. The supporting base material 105 includes, for example, a stainless steel material (JIS standard SUS 430). Then, a base material 104 is injection molded between the supporting base material 105 and the conductive patterns 103. The base material 104 includes, for example, an epoxy resin (molded resin) used as a thermosetting semiconductor sealing resin that is added with approximately 1% of a releasing agent. By adding the releasing agent, the base material 104 can attain a liquid repellent property (or have its liquid repellent property increased), so that fine patterns can be formed (printed) thereon in a subsequent process.

Figure 4E:
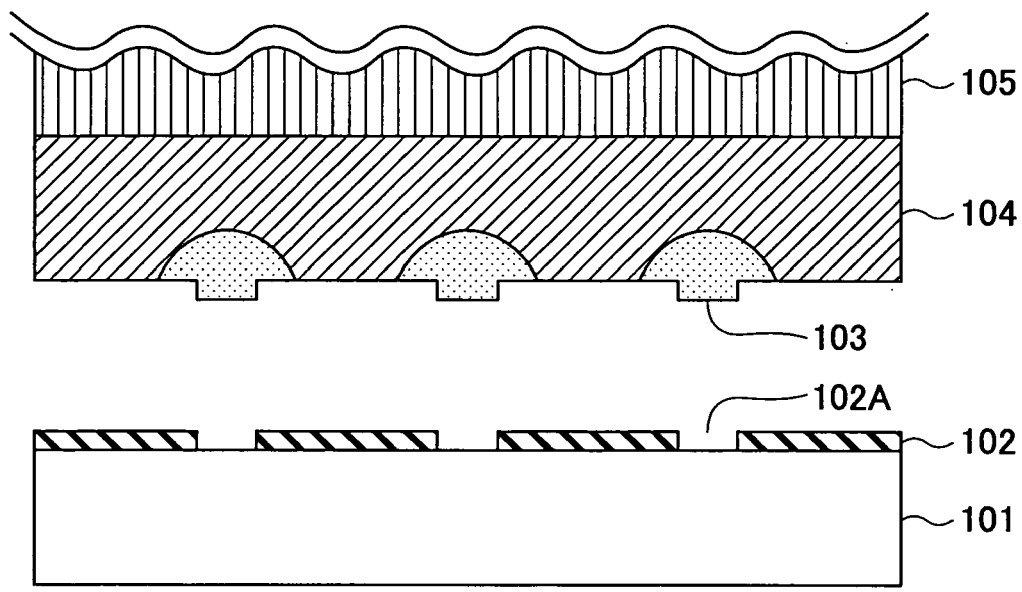

Next, in the step shown in FIG. 4E, the insulating layer 104 and the conductive patterns 103 are separated (removed) together as a united body from the supporting substrate 101 and the insulating layer 102.

Figure 4F:
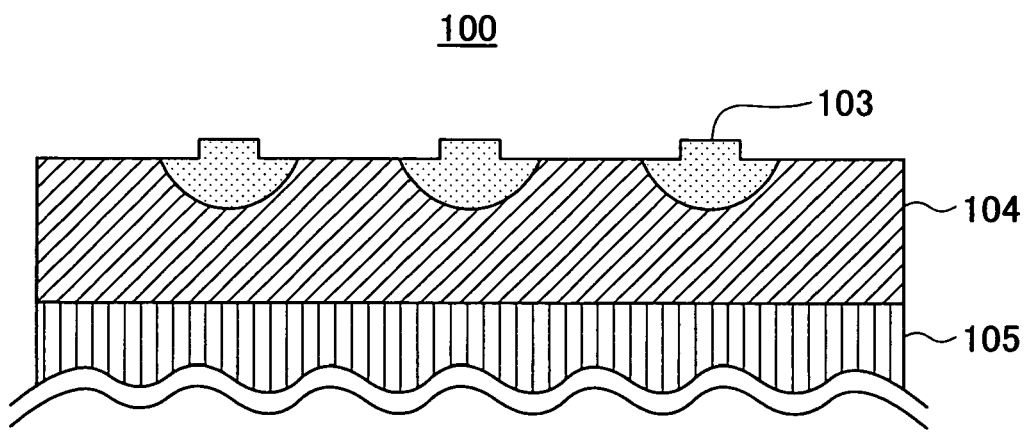

Next, in the step shown in FIG. 4F, Ni, Au plating (not shown) is performed on the surface of the conductive patterns 103, to thereby obtain a first structure 100.

The first structure 100 has a low resistance value owing to the fact that although the amount in which the conductive pattern 103 protrudes from the surface of the base material 104 is small, the amount in which the conductive pattern 103 is buried inside the base material 104 is large.

Next, the steps of fabricating an electric component by using the first structure 100 according to the third embodiment of the present invention are described with reference to FIGS. 5A-5C.

Figure 5A:
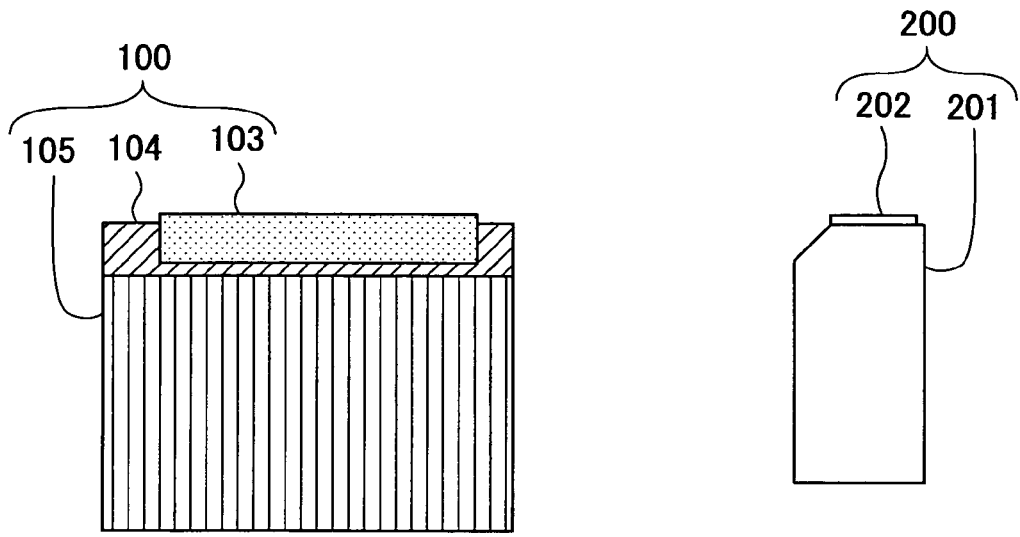
FIGS. 5A-5C are schematic drawings for describing a method of forming a conductive pattern according to a third embodiment of the present invention.

First, in the step shown in FIG. 5A, a second structure 200, which is to be connected to the above-described first structure 100, is formed. The second structure 200 has a configuration in which an electrode 202 is formed on a substantially rectangular function element 201. The function element 201 includes, for example, a piezoelectric element. The edge of the function element 201 is chamfered. It is to be noted that FIG. 5A is a cross-sectional view where the configuration shown in FIG. 4F is rotated 90 degrees.

Figure 5B:
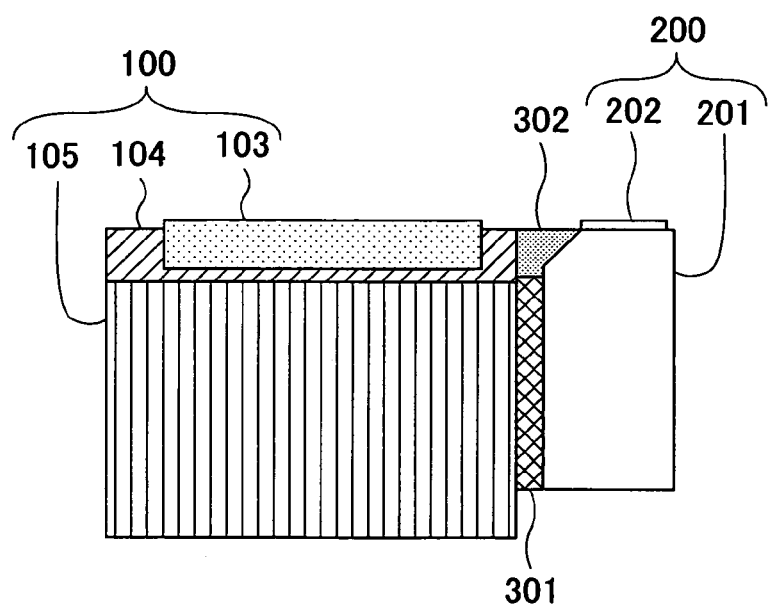

Next, in the step shown in FIG. 5B, the first structure 100 and the second structure 200 are bonded together, for example, by using a conductive adhesive agent. In this case, it is preferable to perform Ni, Au plating on the side of the supporting base material 105 facing the function element 201.

By forming a common electrode at the bonding surface between the supporting substrate 105 and the function element 201, the common electrode can have a greater area than the function element 201. Thereby, the resistance value of the common electrode can be satisfactorily reduced.

In this case, the surface of the base material 104 on which the conductive patterns 103 are formed is substantially flush with the surface of the function element on which the electrode 202 is formed.

Furthermore, a surface joint part 302 is formed at the chamfered edge of the function element (as shown in FIG. 5A, facing the base material 104 and situated in the vicinity of the surface on which the electrode 202 is formed).

The surface joint part 302 formed by applying an epoxy resin base underfill material added with 1% of releasing agent from a dispenser and thermally curing the underfill material applied to the chamfered edge. In this case, by adding the releasing agent, the surface joint part 302 can attain a liquid repellent property (or have its liquid repellent property increased), so that fine patterns can be formed (printed) thereon in a subsequent process.

Accordingly, a connection surface is obtained by forming the surface joint part 302 between the surface of the base material 104 on which the conductive pattern 103 is formed and the surface of the function element 201 on which the electrode 202 is formed. The connection surface is substantially flush with the surface of the base material 104 on which the conductive pattern 103 is formed and the surface of the function element 201 on which the electrode 202 is formed.

Furthermore, the function element 201 and the electrode 202 are cut into strip-like structures, for example, by using a dicing machine, so that plural structures including the electrode 202 and the function element 201 can be fabricated in correspondence with plural conductive patterns 103.

Next, a conductive pattern 303 is formed in a manner similar to the step shown in FIG. 2C of the second embodiment of the present invention. The conductive pattern 303 is formed by applying (jetting) a silver nanoink (manufactured by Sumitomo Electric Industries Ltd.) by using, for example, an inkjet method. The conductive pattern 43 is formed as a substantially straight line extending from the conductive pattern 103 to the electrode 202 via the surfaces of the base material 104 and the surface joint part 302, so that the conductive pattern 103 and the electrode 202 are electrically connected. In this case, since a liquid repellent property is provided (or increased) at the base material 104 and the surface joint part 302 by adding the releasing agent, fine conductive patterns can be formed on the surfaces of the base material 104 and the surface joint part 302. For example, in this case, the conductive pattern 303 can be formed having a width that is no greater than 50 μm.

Since the conductive pattern 303 in this example is formed having a thickness of approximately 2 μm, the stepped area (height difference) between the conductive pattern 103 and the base material 104 is relatively small. Thereby, disconnection (e.g. cracks) at the conductive pattern 303 can be prevented, and a secure configuration can be attained.

Next, in a manner similar to the step shown in FIG. 2D, an insulating layer 304 is formed in a manner covering the conductive pattern 303. The insulating layer 304 is formed not only on a part of the conductive pattern 302 and a part of the electrode 202, but also on the lyophilic area on the base material 104 (lyophilic surface 104B) and the lyophilic area on the surface joint part 302 (lyophilic surface 302B). In other words, the insulating layer 304 is formed in-between adjacent conductive patterns 103 and in-between adjacent conductive patterns 303. Since the surface of the base material 104 and the surface of the surface joint part 302 are subjected to the lyophilic process, a satisfactory adhering strength between the insulating layer 304 and these lyophilic surfaces can be obtained. The area in which the insulating layer 304 is formed is described in detail below with reference to FIG. 6.

The insulating layer 304 according to an embodiment of the present invention is formed with a resin material (Hitachi Chemical Co. Ltd., SN-9000 series) and is applied onto the surface of the base material 104 and the surface of the surface joint part 302 by using a coating method.

Then, the base material 104 is heated at a temperature of 200° C. for 30 minutes. The heating process causes the dispersion materials of silver nanoink included in the conductive pattern 303 to volatilize (evaporate) and the silver particles included in the conductive pattern 303 to fuse together. Furthermore, the heating process also serves to thermally cure the insulating layer 304. In this case, it is preferable to use a thermosetting resin material as the material of the insulating layer 304.

Since a satisfactory adhering strength between the insulating layer 304 and the lyophilic surfaces 104B, 302B can be attained with the above-described configuration, the conductive pattern 303 can be prevented from separating and a secure structure can be obtained.

The above-described method of forming the conductive patterns enables fabrication of an electric component 300 where the base material 104 is connected to the function element 201 and the conductive pattern 103 is connected to the electrode 202 with the conductive pattern 302 being covered by the insulating layer 304.

Furthermore, the electric component 300 according to the above-described embodiment of the present invention can be employed as an inkjet head of an image forming apparatus. In this case, it is preferable to mount a driver IC of the function element by a flip chip method for connecting with the conductive pattern 103.

Figure 5C:
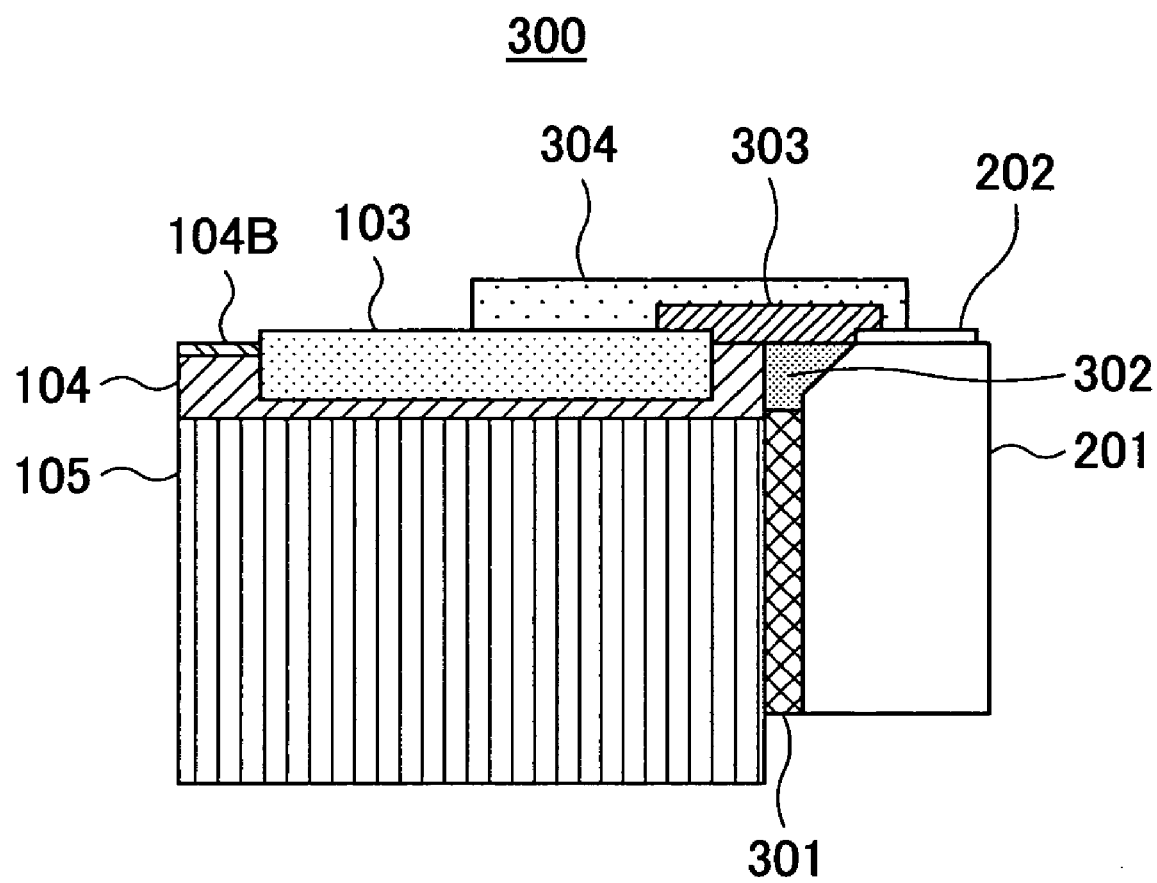
Figure 6:
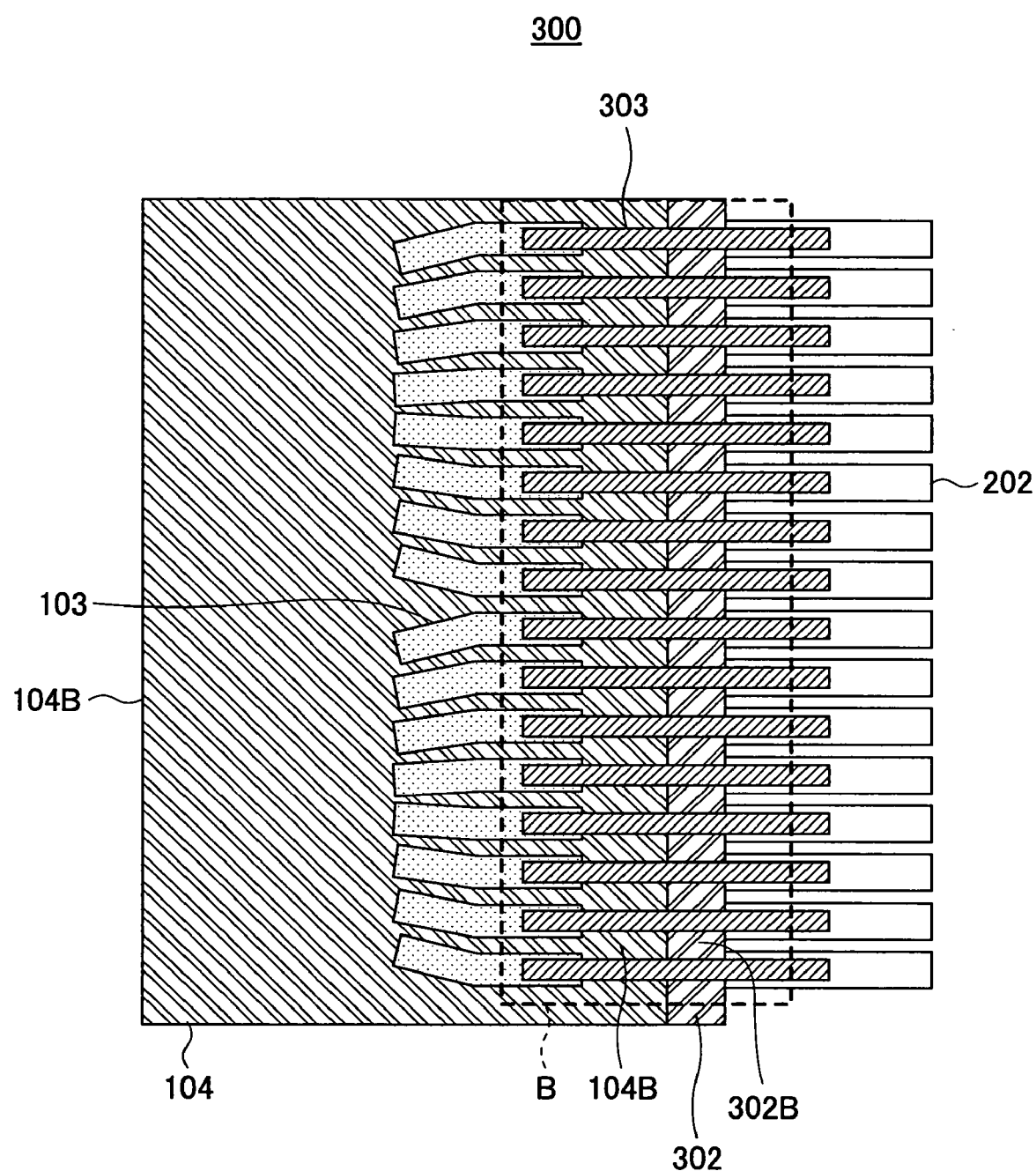
FIG. 6 is a plan view of an electric component according to the third embodiment of the present invention.

FIG. 6 is a plan view of the electric component (inkjet head) 300 of FIG. 5C when viewed from the side where the insulating layer 304 is formed. It is to be noted that like components are denoted with like reference numerals as of FIGS. 5A-5C and further description thereof is omitted. Furthermore, in FIG. 6, the insulating layer 304 is not illustrated so as to provide a better view of the electric component 300, and the part that is surrounded by broken lines (area B) is the area in which the insulating layer 304 is formed.

As shown in FIG. 6, the electric component (inkjet head) 300 according to the above-described embodiment of the present invention has a configuration in which the conductive pattern 303 electrically connects the conductive pattern 103 of the base material 104 to the electrode 202 of the function element 201 (not shown in FIG. 6).

In this case, the electrode 202 and the function element 201 are cut into strip-like structures, for example, by a dicing machine so that plural structures including the electrode 202 and the function element 201 can be fabricated in correspondence with plural conductive patterns 103.

Furthermore, the insulating layer 304 (not shown in FIG. 6) is formed in a manner covering not only the conductive pattern 303, but also part of the conductive pattern 103 and part of the electrode 202. Furthermore, the insulating layer 304 (not shown in FIG. 6) is formed in-between adjacently arranged conductive patterns 103 and in-between adjacently arranged conductive patterns 303.

In this case, the spaces between the adjacently arranged conductive patterns 103 and the spaces between the adjacently arranged conductive patterns 303 are subjected to the lyophilic process and are thereby formed as lyophilic surfaces 104B. Likewise, the spaces between the conductive patterns 303 on the surface joint part 302 (connection surface) are also subjected to the lyophilic process and are thereby formed as lyophilic surfaces 302B.

Accordingly, since a satisfactory adhering strength between the insulating layer 304 (not shown in FIG. 6) and the lyophilic surfaces 104B, 302B can be attained, the conductive pattern 303 can be prevented from separating and a secure structure can be obtained.

Furthermore, in forming the insulating layer 304, an ion trapping agent including, for example, 2-4-diamino-6-vinyl-S-triamine and isocyanuric acid, may be kneaded into the resin material of the insulating layer 304. It is preferable to employ a compound having an S-triazine ring as the ion trapping agent.

Such kneading of the ion trapping agent prevents migration of silver particles when forming conductive patterns with silver nanoink.

The fact that the ion trapping agent prevents the migration of silver particles was discovered by performing the migration test described below.

This test was conducted by covering a wiring pattern (0.5 mm gap between electrodes) with an insulating layer and applying DC 100 V in an atmosphere of 85° C. and 85% Rh. The wiring pattern is printed with silver nano ink in a needle-like manner onto a PET substrate. In a case where no ion trapping agent is added to the insulating layer, a branch-like growth of silver (generation of silver migration) was found between the electrodes after approximately 100 hours had elapsed. Meanwhile, no migration was found even after approximately 1000 hours had elapsed in a case where the ion trapping agent is added to the insulating layer.

Fourth Embodiment

In forming the first structure 100, although the substrate 104 is separated from the insulating layer 102 in the step shown in FIG. 4E according to the third embodiment of the present invention, the below-described method may alternatively be employed.

FIG. 7A-7E shows another method of forming a conductive pattern according to the fourth embodiment of the present invention. It is to be noted that like components are denoted with like reference numerals as of the third embodiment and further description thereof is omitted.

First, same as the steps shown in FIGS. 4A-4B in the third embodiment, the insulating layer 102 including DLC is formed with patterned aperture parts 102A on the supporting substrate 101.

Figure 7A:
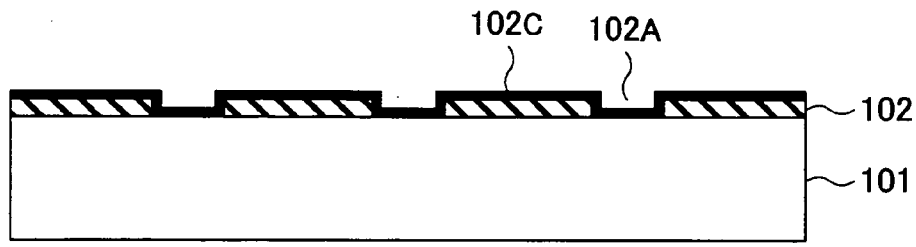
FIGS. 7A-7E are schematic drawings for describing a method of transferring a conductive pattern according to a fourth embodiment of the present invention.

Next, in the step shown in FIG. 7A, a coating layer 102C having a thickness of approximately 0.05 μm is formed on the insulating layer 102 and the areas of the supporting substrate 101 at which the aperture parts 102A are formed. The coating layer 102C includes, for example, a fluoric coating material (fluorosurf FG-5000, manufactured by Fluoro Technology Co. Ltd.).

Figure 7B:
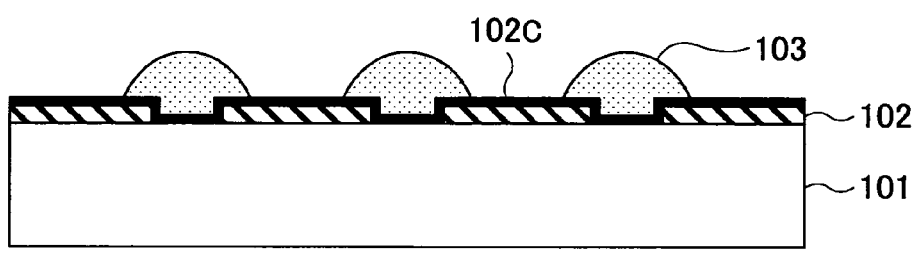

Next, in the step shown in FIG. 7B, the supporting substrate 101 is used as an electrode for performing electrolytic plating, to thereby form conductive patterns (e.g. Cu patterns) 103 at areas corresponding to the aperture parts 102A. The thickness of the conductive patterns 103 is approximately 10 μm. Since the conductive patterns 103 have a greater thickness than the insulating layer 102, the cross-section of the conductive pattern 103 has a mushroom-like shape. Since the coating layer 102C is thin (in this example, a thickness of 0.05 μm), the electrolytic plating method can be performed.

Same as the third embodiment of the present invention, the surface reforming process is performed on the conductive pattern 103. In this process, the surface of the conductive pattern 103 is treated with a predetermined chemical agent (Copper Bond, manufactured by Ebara-Udylite Co. Ltd.). This process improves the adhering strength with respect to a base material that is formed covering the exposed parts of the conductive patterns 103 in a subsequent step. By performing the surface reforming process, the thickness of the conductive patterns 103 becomes approximately 8 μm. Thereby, the thickness of the conductive patterns 103 becomes substantially equal to the thickness of the insulating layer 102. It is, however, to be noted that the exposed portion of the conductive patterns 103 protruding from the insulating layer 102 is illustrated in an enlarged manner in FIG. 7B and after for making the configuration easier to understand.

Figure 7C:
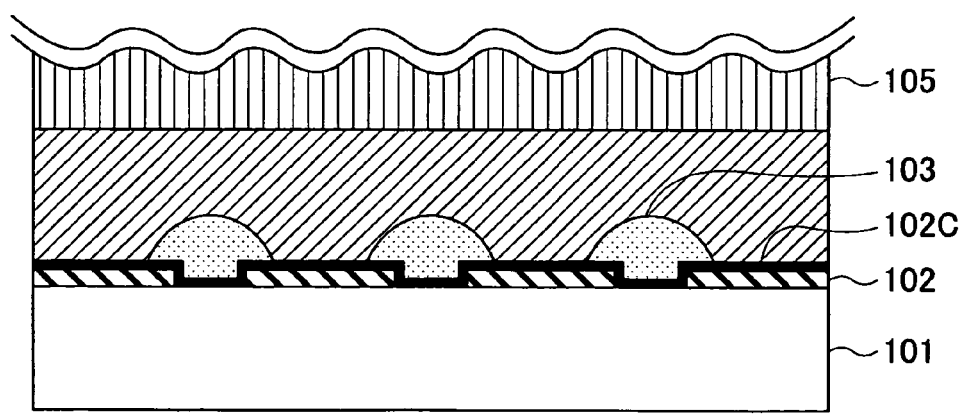

Next, in the step shown in FIG. 7C, a supporting base material 105 is placed above the conductive patterns 103 in a manner facing the supporting substrate 101 (same as the step shown in FIG. 4D of the third embodiment). The supporting base material 105 includes, for example, a stainless steel material (JIS standard SUS 430). Then, a base material 104 is injection molded between the supporting base material 105 and the conductive patterns 103. The base material 104 includes, for example, an epoxy resin (molded resin) used as a thermosetting semiconductor sealing resin.

Figure 7D:
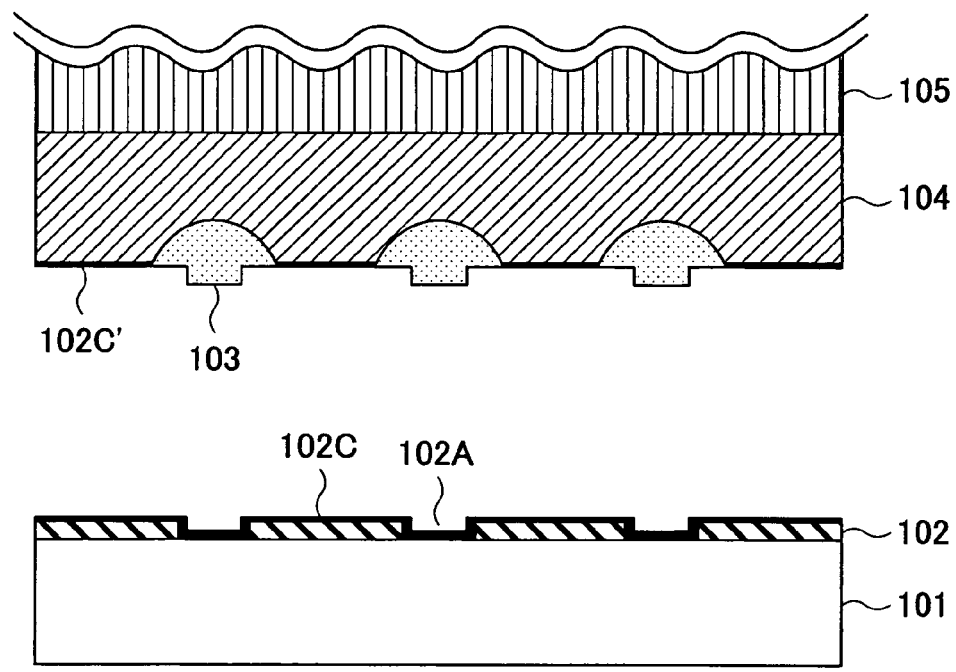

Next, in the step shown in FIG. 7D, the insulating layer 104 and the conductive patterns 103 are separated (removed) together as a united body from the supporting substrate 101 and the insulating layer 102 (same as the step shown in FIG. 4E of the third embodiment).

Since the coating layer 102C is formed on the insulating layer 102, the coating layer 102C functions as a releasing layer which enhances releasing property particularly for the base material 104. Thereby, the base material 104 can easily be separated from the insulating layer 102. Furthermore, a part of the coating layer 102 is transferred to the surface of the base material 104, to thereby form a coating layer 102C'.

Figure 7E:
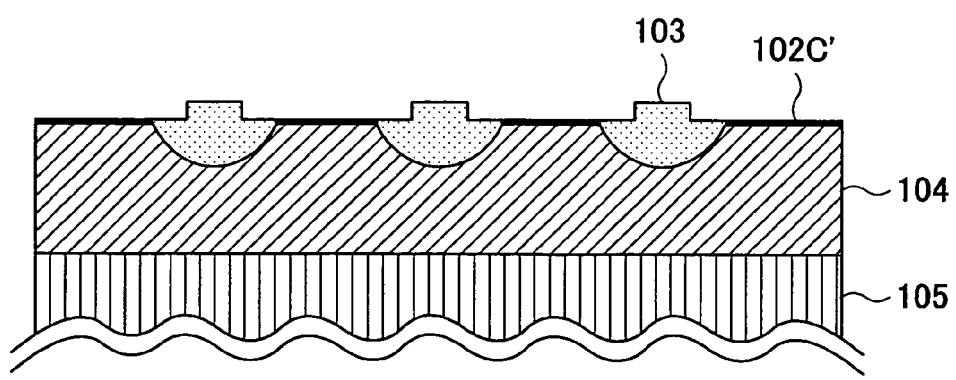

Next, in the step shown in FIG. 7E, Ni, Au plating (not shown) is performed on the surface of the conductive patterns 103, to thereby obtain a first structure 100A (same as the step shown in FIG. 4F of the third embodiment).

Same as the first structure 100 of the third embodiment, the first structure 100A also has a low resistance value owing to the fact that although the amount in which the conductive pattern 103 protrudes from the surface of the base material 104 is small, the amount in which the conductive pattern 103 is buried inside the base material 104 is large.

Furthermore, in the first structure 100A, the surface of the base material 104 has a liquid repellent property onto which fine conductive patterns can be formed by a printing method owing to the fact that the above-described coating layer 102C' is formed on the surface of the base material 104. In this case, the process of adding a releasing agent upon molding the base material 104 can be omitted.

In examining the contact angle of the silver nano ink on the surface of the base material 104 of the first structure 100A according to an embodiment of the present invention, it was found that the surface of the base material has a high liquid repellent property in which the contact angle thereof is 55 degrees or more.

Furthermore, same as the third embodiment, an electric component can be fabricated by using the first structure 10A. In this case, the electric component can be fabricated by replacing the first structure 100 with the first structure 100A and performing the steps shown in FIGS. 5A-5C of the third embodiment.

Hence, the method of forming a conductive pattern according to an embodiment of the present invention can be executing by employing various conductive patterns (wiring patterns) and base materials (e.g. substrate) for forming the conductive patterns.

Fifth Embodiment

In recent years and continuing, it is desired to form fine conductive patterns on electric components (e.g. inkjet heads) such as those described in the first-fourth embodiments. However, in forming such fine conductive patterns, the electric resistance of the conductive patterns tends to become greater as the size of the conductive patterns become finer (as the width of the conductive patterns become smaller). Therefore, in fabricating an electric component (e.g. inkjet head), it is desired to fabricate the electric component that allows fine conductive patterns to be formed thereon while preventing electric resistance from becoming larger (or preventing electric resistance from becoming smaller).

For example, in order to reduce the electric resistance of the conductive patterns, there is one method in which the height (thickness) of the conductive pattern is increased. However, since the conductive patterns that are formed by the printing method have a relatively large stress, the conductive patterns tend to undesirably separate from the base material in a case where the conductive patterns are thickly formed.

Therefore, the below-described embodiment of the present invention employs a method of forming a conductive pattern on a base material by using a printing method and then forming an upper conductive pattern on the conductive pattern by using a plating method.

With the below-described embodiment, the conductive path comprising the conductive pattern formed by the printing method and the upper conductive pattern formed on the conductive pattern can have less electric resistance. Furthermore, since the upper conductive pattern formed by the plating method has less stress compared to the conductive pattern formed by the printing method, the conductive pattern is less likely to separate from the base material even when the conductive pattern is thickly formed. Thereby, a more reliable wiring can be obtained.

As the plating methods for forming the upper conductive pattern, there are, for example, an electrolytic plating method and an electroless plating method. The following fifth embodiment of the present invention describes a case of using the electrolytic plating method and the sixth embodiment of the present invention describes a case of using the electroless plating method.

The case of forming the upper conductive pattern with the electrolytic plating method according to the fifth embodiment is described with reference to FIGS. 8A-8E. It is to be noted that like components are denoted with like reference numerals as of the above-described embodiments and further description thereof is omitted.

Figure 8A:
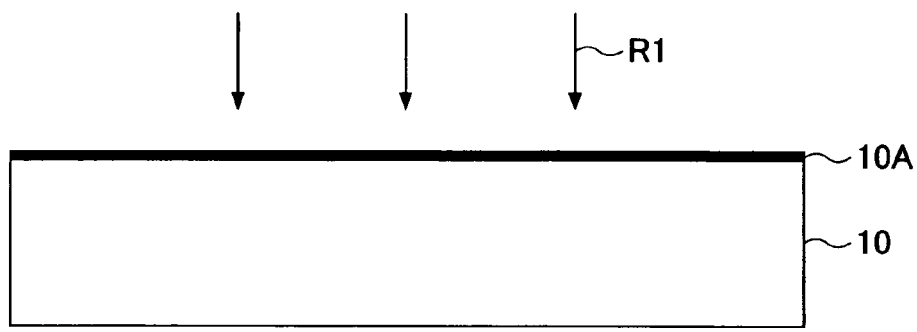
FIGS. 8A-8E are schematic drawings for describing a method of transferring a conductive pattern according to a fifth embodiment of the present invention.

In the step shown in FIG. 8A, a liquid repellent surface 10A is formed on the surface of a base material 10 comprising a resin material (e.g. polyimide) by providing a liquid repellent property (liquid repellency) to the surface of the base material 10 (same as the step shown in FIG. 1A of the first embodiment).

In this step, although not shown in the drawings, an atmospheric pressure plasma surface processing apparatus (remote type plasma processing apparatus manufactured by Sekisui Chemical) is used for performing the liquid repellent process on the base material 10. More specifically, $CF_4$ gas is supplied to the surface processing apparatus at a rate of 0.5 L/min, next a processing gas R1 is formed by activating the $CF_4$ gas with plasma, and then the processing gas R1 is applied onto the surface of the base material 10.

Figure 8B:
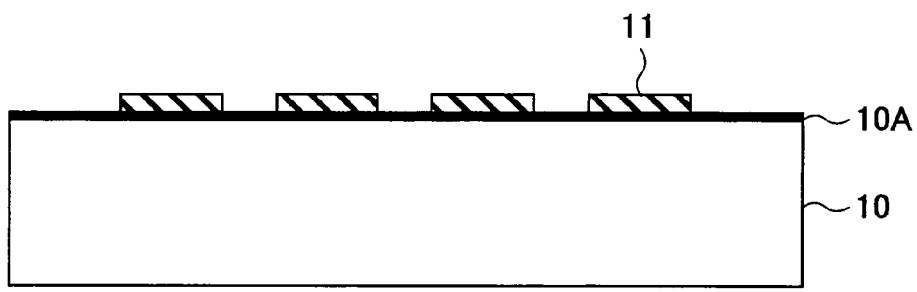

Next, in the step shown in FIG. 8B, a conductive pattern 11 is formed on the surface of the base material 10 (i.e. liquid repellent surface 10A) by using a printing method. More specifically, a silver nanoink (manufactured by Sumitomo Electric Industries Ltd.) is applied on the liquid repellent surface 10A by using, for example, an inkjet method. Since the liquid repellent surface 10A has a high liquid repellency, the diameter of the area at which an ink droplet contacts the liquid repellent surface 10A is 40 µm, and therefore, the width of the conductive pattern 11 is 40 µm. Furthermore, the silver nanoink includes metal particles (silver particles) having a particle diameter that is no greater than 100 nm. The metal particles become the current carrying path (feed path) when performing an electrolytic plating process in a subsequent step.

Furthermore, it is preferable to heat the conductive pattern 11 for reducing the value of the electric resistance of the conductive pattern 11. Accordingly, in order to use the conductive pattern 11 as the current carrying path for performing the electrolytic plating process, the conductive pattern 11 (base material 10) is heated at a temperature of 180° C. for 30 minutes. The heating process causes the dispersion materials of silver nanoink included in the conductive pattern 11 to volatilize (evaporate) and the metal particles (silver particles) included in the conductive pattern 11 to fuse together. Thereby, the electric resistance value of the conductive pattern 11 can be reduced for providing conductivity to the conductive pattern 11.

Figure 8C:
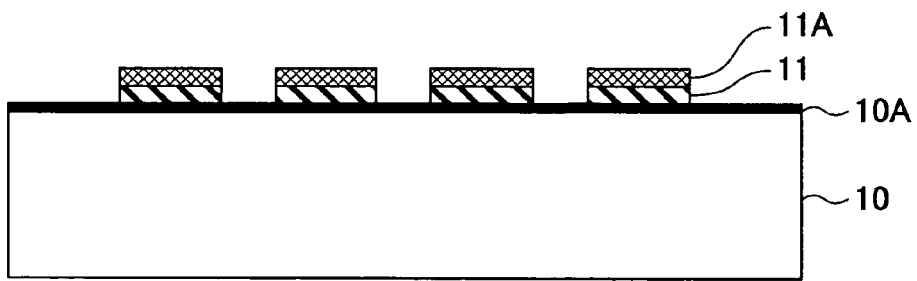

In the step shown in FIG. 8C, an electrolytic plating process is performed by employing a plating liquid (brush plating liquid, manufacture by Yamamoto MS Co. Ltd) and using the conductive pattern 11 as the feed path. As a result, the upper conductive pattern 11A including Cu material is formed (layered) on the conductive pattern 11. Since the electrolytic plating method is used, the upper conductive pattern 11A can be formed with a satisfactory productivity (depositing rate). After the upper conductive pattern 11A is formed, the base material 10 (the upper conductive pattern 11A) is cleaned and dried.

Figure 8D:
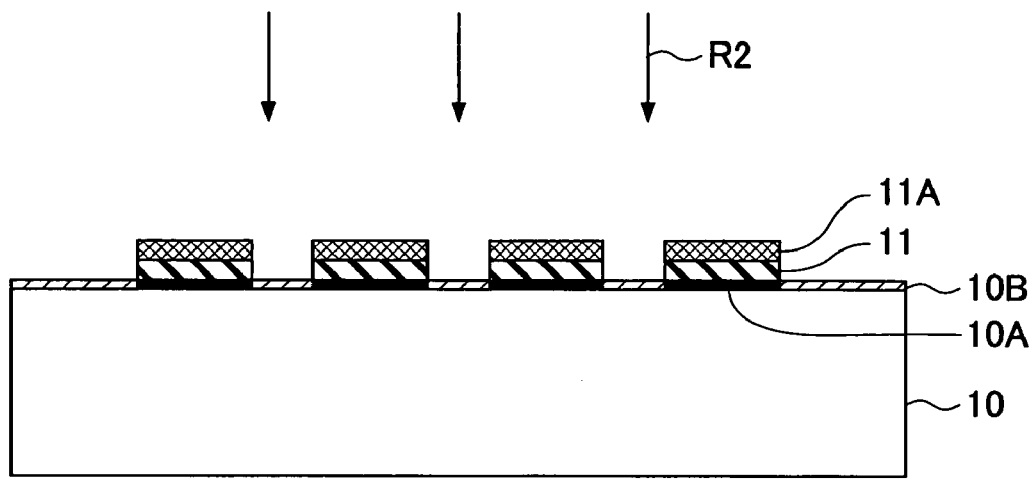

Next, in the step shown in FIG. 8D (same as the step shown in FIG. 1C), a process of providing a lyophilic property (lyophilic process) is performed on the areas of surface of the base material 10 on which no conductive pattern 11 is formed, that is, the areas of the liquid repellent surface 10A which are not covered by the conductive pattern 11. Accordingly, a lyophilic surface 10B is formed on these areas.

In this step, although not shown in the drawings, an atmospheric pressure plasma surface processing apparatus (remote type plasma processing apparatus manufactured by Sekisui Chemical) is used for performing the lyophilic process on the base material 10. More specifically, oxygen gas and nitrogen gas are supplied to the surface processing apparatus, next a processing gas R2 is formed by activating the gases with plasma, and then the processing gas R2 is applied onto the surface of the base material 10 (liquid repellent surface 10A). Thereby, the lyophilic surface 10B can be formed on predetermined areas on the surface of the base material 10.

Figure 8E:
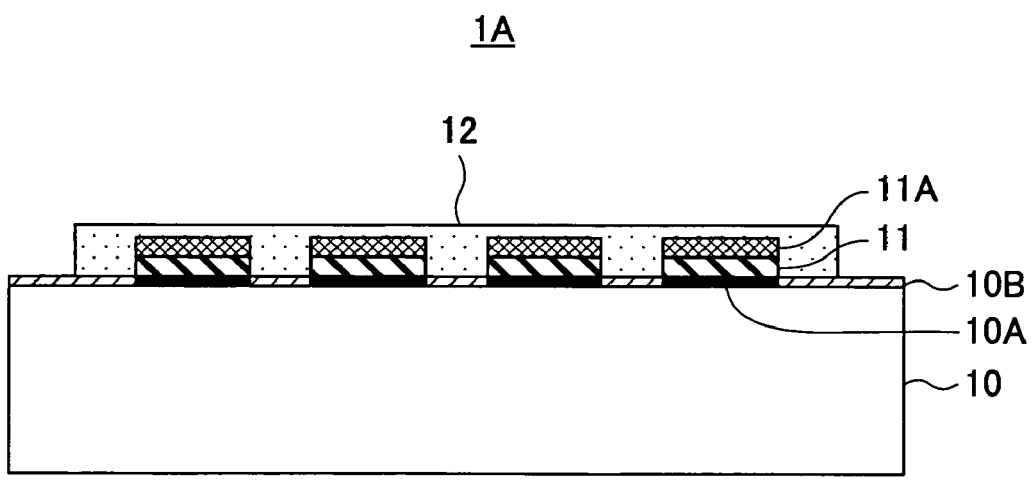

Next, in the step shown in FIG. 8E (same as the step shown in FIG. 1D), an insulating layer 12 is formed on the substrate surface in a manner covering the conductive pattern 11. Since the base material surface is subjected to the lyophilic process, a satisfactory adhering strength between the insulating layer 12 and the lyophilic surface 10B can be obtained.

The insulating layer 12 according to this embodiment of the present invention is formed with a resin material (Hitachi Chemical Co. Ltd., SN-9000 series) and is applied onto the base material surface by using a coating method.

Since a satisfactory adhering strength-between the insulating layer 12 and the lyophilic surface 10B can be obtained, the conductive pattern 11 and the upper conductive pattern 11A can be prevented from separating from the base material surface. Furthermore, the insulating layer 12 also serves as a protective layer of the conductive pattern 11 and the upper conductive pattern 11A for preventing the conductive pattern 11 and the upper conductive pattern 11A from being damaged.

Then, the base material 10 is heated at a temperature of 200° C. for 30 minutes. The heating process serves to thermally cure the insulating layer 12. In this case, it is preferable to use a thermosetting resin material as the material of the insulating layer 12.

Hence, by conducting the above-described method of forming a conductive pattern, an electric component 1A comprising the base material 10 having the conductive pattern 11 formed on its surface, the upper conductive pattern 11A formed (layered) on the conductive pattern 11, and the insulating layer 12 formed on the surface of the base material 10 in a manner covering the conductive pattern 11 and the upper conductive pattern 11A can be fabricated.

In addition to attaining the advantages described in the first embodiment of the present invention, the fifth embodiment of the present invention can attain the following properties.

According to the fifth embodiment of the present invention, the conductive pattern 11 formed by a printed method and the upper conductive pattern 11A formed by a plating method are formed on the base material 10 in a layered manner. Furthermore, with the configuration of having the conductive pattern 11 and the upper conductive pattern 11A formed on the base material 10, the upper conductive pattern 11A formed by the plating method has less stress than the conductive pattern 11 formed by the printing method.

Accordingly, even when the upper conductive pattern 11A is formed having a substantial amount of thickness (height), the upper conductive pattern 11A can be prevented from separating from the base material 10 (conductive pattern 11). That is, with the method of forming a conductive pattern according to the fifth embodiment, the upper conductive pattern 11 can have low electric resistance and can be resistant to separation from the base material. Therefore, a reliable electric component (inkjet head) including the conductive pattern can be fabricated. In other words, with the method of forming a conductive pattern according to the fifth embodiment, a reliable electric component (inkjet head) allowing fine wiring patterns to be formed thereon can be obtained.

Sixth Embodiment

Next, a case of forming the upper conductive pattern by using an electroless plating method according to the sixth embodiment of the present invention is described with reference to FIGS. 9A-9E. It is to be noted that like components are denoted with like reference numerals as of the above-described embodiments and further description thereof is omitted.

Figure 9A:
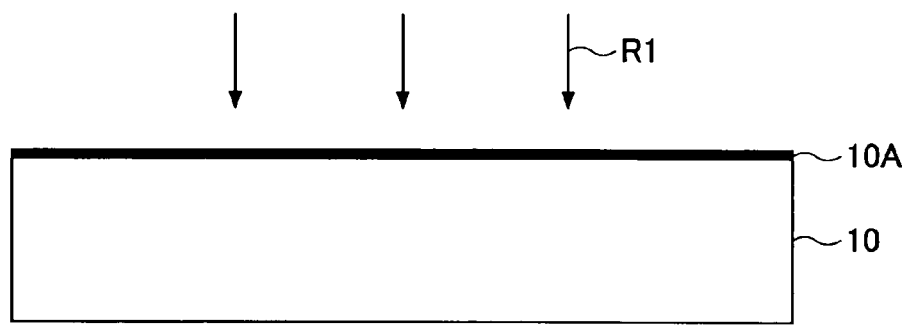
FIGS. 9A-9E are schematic drawings for describing a method of transferring a conductive pattern according to a sixth embodiment of the present invention.
Figure 9B:
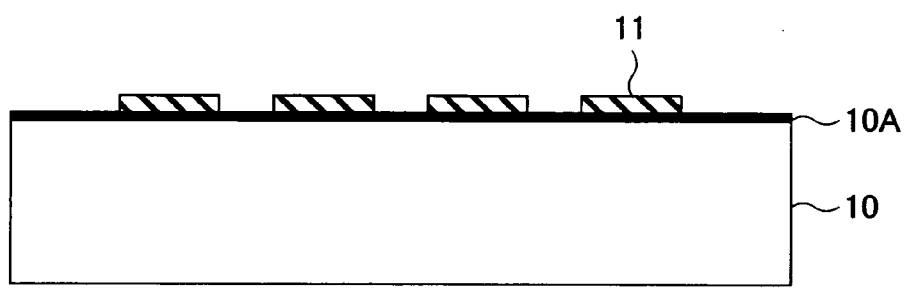

The steps shown in FIGS. 9A and 9B are the same as those shown in FIGS. 8A and 8B of the fifth embodiment. It is to be noted that the silver nanoink used for forming the conductive pattern includes metal particles (silver particles) having a particle diameter that is no greater than 100 nm. The metal particles function as a catalyst when performing an electroless plating process in a subsequent step.

Furthermore, in printing the conductive pattern 11 on the surface of the base material 10, the thickness and/or the arrangement (distribution) of the conductive patterns can be changed by adjusting the density of the metal particles (silver particles) in the silver nanoink and the number of times of jetting the silver nanoink. For example, a wiring pattern having metal particles in a connected state can be formed on the base material 10 by jetting silver nanoink, having metal particles with a density of approximately 30 weight percent, onto the base material 10 for plural number of times. Furthermore, a wiring pattern having metal particles in a partly scattered state can be formed on the base material 10 by jetting the silver nanoink having metal particles with reduced density.

Figure 9C:
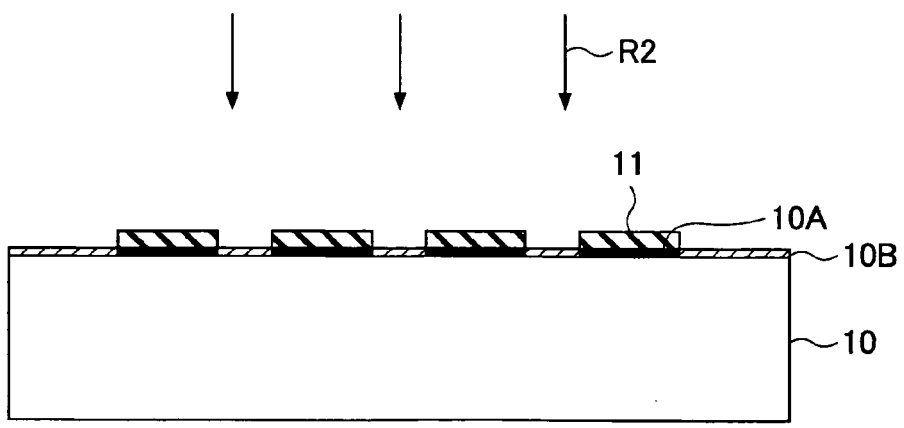

Next, in the step shown in FIG. 9C, the metal particles included in the conductive pattern 11 are subjected to an activation process since the metal particles are to be used as a catalyst for performing an electroless plating process in a subsequent step.

This activation process is performed in the same manner as the step shown in FIG. 8D of the fifth embodiment. That is, the activation process performed on the metal particles and the lyophilic process (formation of the lyophilic surface 10B) performed on the areas having no conductive pattern formed thereon are performed at the same time (in the same step). The lyophilic process is performed, for example, by using an atmospheric pressure plasma surface processing apparatus (remote type plasma processing apparatus manufactured by Sekisui Chemical) for applying a plasma-activated oxygen gas and nitrogen gas onto the base material surface, to thereby dissolve the dispersion materials included in metal particles (silver particles) on the surface of the conductive pattern 11 and dissolve the C—F bond formed on the base material surface.

Figure 9D:
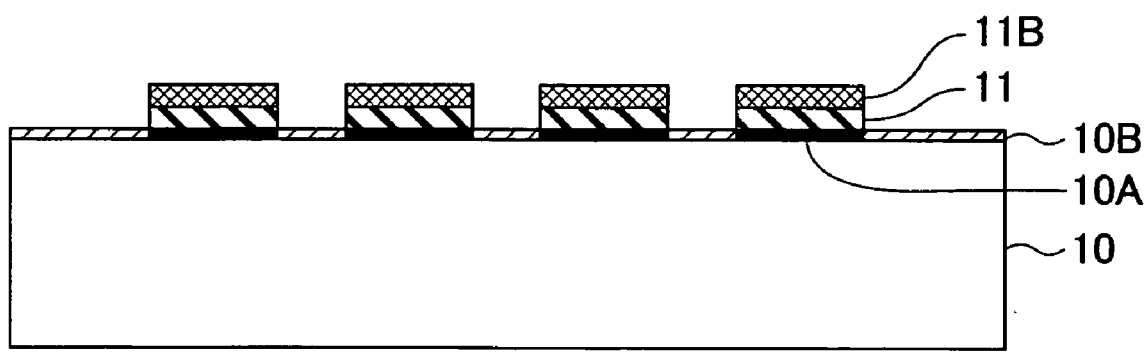

Next, in the step shown in FIG. 9D, an electroless plating method is performed by employing an electroless plating liquid (TSP copper, manufactured by Okuno Chemical Industries Co. Ltd.) and using the metal particles as a catalyst. As a result, the upper conductive pattern 11A including Cu material is formed (layered) on the conductive pattern 11. More specifically, in this example, the plating process is conducted for two hours, in which the liquid temperature of the electroless plating liquid used in this process is set to 40° C. Thereby, an upper conductive pattern 11B having a thickness of approximately 3 μm is formed (layered) on the conductive pattern 11. The metal particles may be formed in a connected state or in a scattered state in the conductive pattern 11.

Figure 9E:
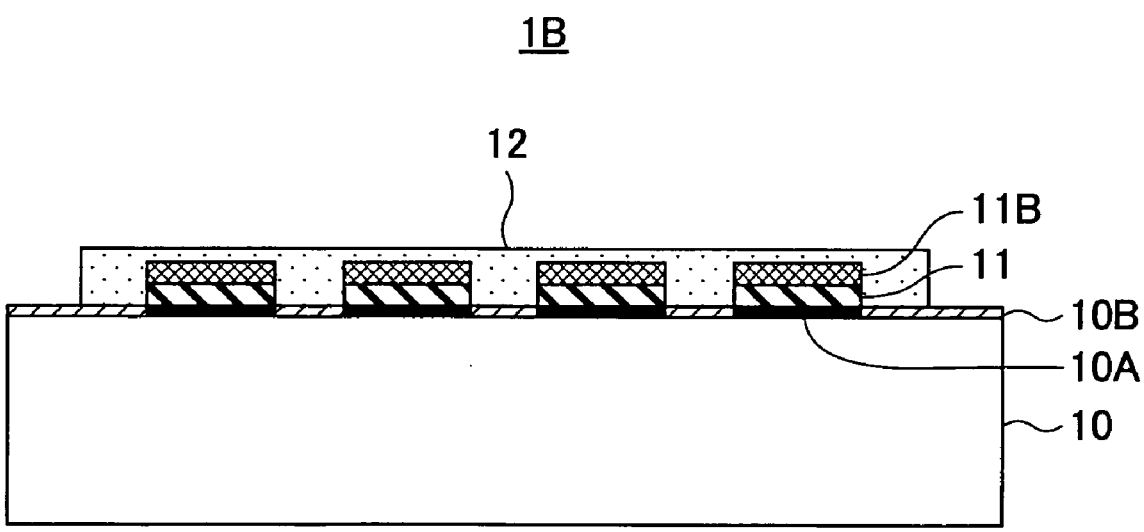

Next, in the step shown in FIG. 9E, a UV curing type overcoat material (UVCF-535, manufactured by Taiyo Ink MFG Co. Ltd.) is applied to the base material surface and the surface of the upper conductive pattern 11B. The overcoat material is cured by having UV rays irradiated thereto. Thereby, an insulating layer 12 is formed on the base material surface and the surface of the upper conductive pattern 11B. A thermosetting material such as the one used in the fifth embodiment may alternatively be used as the material of the insulating layer 12.

Since a satisfactory adhering strength between the insulating layer 12 and the lyophilic surface 10B can be obtained, the conductive pattern 11 and the upper conductive pattern 11B can be prevented from separating from the base material surface. Furthermore, the insulating layer 12 also serves as a protective layer of the conductive pattern 11 and the upper conductive pattern 11B for preventing the conductive pattern 11 and the upper conductive pattern 11B from being damaged.

Hence, by conducting the above-described method of forming a conductive pattern, an electric component 1B comprising the base material 10 having the conductive pattern 11 formed on its surface, the upper conductive pattern 11B formed (layered) on the conductive pattern 11, and the insulating layer 12 formed on the surface of the base material 10 in a manner covering the conductive pattern 11 and the upper conductive pattern 11B can be fabricated.

In addition to attaining the advantages described in the fifth embodiment of the present invention, the sixth embodiment of the present invention can attain the following properties. For example, the step of heating the conductive pattern 11 in high temperature can be omitted since the conductive pattern 11 is not required to serve as a feed path during the plating process. Therefore, the step of heating the base material 10 can be omitted by forming the insulting layer with a UV curing type material. By omitting the heating process, the conductive patterns 11, 11B can be prevented from separating or cracking due to thermal stress. Thereby, a reliable wiring pattern can be fabricated.

Although the foregoing embodiments of the present invention are described using examples where metal nanoink (silver nanoink) is used for forming the conductive material 11, other material may also be used. For example, the ink used for forming the conductive pattern may be other types of ink as long as it provides a catalyst function during the electroless plating process. Furthermore, the metal particles included in the metal nanoink are not limited to silver particles. For example, palladium particles may also be used.

Furthermore, a slight amount of binder material, for example, may be added to the metal nanoink for further increasing the adhering strength between the conductive pattern and the base material.

Furthermore, the method described in the fifth and sixth embodiments may be used in combination with the methods described in the second to fourth embodiments for fabricating various electric components (e.g. inkjet head).

Further, the present invention is not limited to these embodiments, but variations and modifications may be made without departing from the scope of the present invention.

The present application is based on Japanese Priority Application Nos.2005-133225 and 2006-031258 filed on Apr. 28, 2005 and Feb. 8, 2006, with the Japanese Patent Office, the entire contents of which are hereby incorporated by reference.

What is claimed is:

1. A method of forming a conductive pattern comprising the steps of:
   a) forming a conductive pattern onto a surface of a base material having a liquid repellent property;
   b) providing a lyophilic property to a predetermined area of the surface of the base material which area does not have the conductive pattern formed thereon; and
   c) forming an insulating layer that covers the conductive pattern and the base material, wherein the predetermined area of the surface of the base material has the lyophilic property, and areas of the surface of the base material on which the conductive pattern is formed have the liquid repellent property.

2. The method of forming a conductive pattern as claimed in claim 1, further comprising a step of: forming an upper conductive pattern on the conductive pattern after step a) by using a plating method.

3. The method of forming a conductive pattern as claimed in claim 2, wherein the conductive pattern includes metal particles, wherein the plating method includes an electroless plating method using the metal particles as a catalyst for forming the upper conductive pattern.

4. The method of forming a conductive pattern as claimed in claim 2, wherein the plating method includes an electrolytic plating method using the conductive pattern as a feed path for forming the upper conductive pattern.

5. The method of forming a conductive pattern as claim in claim 1, further comprising a step of: forming the base material that has added a releasing agent before step a).

6. The method of forming a conductive pattern as claimed in claim 1, further comprising a step of:
   providing the liquid repellent property to the surface of the base material before step a).

7. The method of forming a conductive pattern as claimed in claim 6, wherein the liquid repellent property is provided to the surface of the base material by applying a plasma excited gas to the surface of the base material.

8. The method of forming a conductive pattern as claimed in claim 1, wherein the lyophilic property is provided to the predetermined area by applying a plasma excited gas to the surface of the base material in step b).

9. The method of forming a conductive pattern as claimed in claim 1, further comprising the steps of:
   connecting the base material to a function element on which a second conductive pattern is formed; and
   forming a third conductive pattern on at least a part of the conductive pattern and a part of the second conductive pattern.

10. The method of forming a conductive pattern as claimed in claim 1, wherein step a) includes the steps of:
    forming a mask pattern on a supporting substrate;
    growing the conductive pattern in an aperture part of the mask pattern by using a plating method, and
    transferring the conductive pattern to the base material.

11. The method of forming a conductive pattern as claimed in claim 1, wherein the predetermined area having the lyophilic property on the surface of the base material does not have the liquid repellent property.

12. The method of forming a conductive pattern as claimed in claim 1, wherein the lyophilic property is provided to the predetermined area in step b), after the conductive pattern is formed onto the surface of the base material in step a).

* * * * *